(12) United States Patent
Higuchi et al.

(10) Patent No.: US 6,960,539 B2
(45) Date of Patent: Nov. 1, 2005

(54) SUBSTRATE FOR ELECTRONIC DEVICES, MANUFACTURING METHOD THEREFOR, AND ELECTRONIC DEVICE

(75) Inventors: Takamitsu Higuchi, Matsumoto (JP); Setsuya Iwashita, Nirasaki (JP); Hiromu Miyazawa, Toyoshina-machi (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/644,989

(22) Filed: Aug. 21, 2003

(65) Prior Publication Data
US 2004/0053460 A1 Mar. 18, 2004

(30) Foreign Application Priority Data

Sep. 5, 2002 (JP) ........................................ 2002-259960
Jul. 9, 2003 (JP) ........................................ 2003-194243

(51) Int. Cl.[7] .............................................. H01L 21/31
(52) U.S. Cl. ...................................... 438/778; 257/410
(58) Field of Search ..................... 438/3, 778; 257/295, 257/410; 427/126.3, 255.19

(56) References Cited

U.S. PATENT DOCUMENTS

| | | |
|---|---|---|
| 5,155,658 A | 10/1992 | Inam et al. |
| 5,173,474 A | 12/1992 | Connell et al. |
| 5,270,298 A | 12/1993 | Ramesh |
| 5,358,925 A | 10/1994 | Neville Connell et al. |
| 5,416,062 A | 5/1995 | Harada et al. |
| 5,801,105 A | 9/1998 | Yano et al. |
| 5,810,923 A | 9/1998 | Yano et al. |
| 5,828,080 A | 10/1998 | Yano et al. |
| 6,045,626 A | 4/2000 | Yano et al. |
| 6,096,434 A | 8/2000 | Yano et al. |
| 6,121,647 A | 9/2000 | Yano et al. |
| 6,232,242 B1 * | 5/2001 | Hata et al. .................. 438/762 |

FOREIGN PATENT DOCUMENTS

| | | |
|---|---|---|
| JP | A 6-097452 | 4/1994 |
| JP | A 8-109099 | 4/1996 |
| JP | A 8-255790 | 10/1996 |
| JP | A 8-264524 | 10/1996 |
| JP | A 9-110592 | 4/1997 |
| JP | A 9-263494 | 10/1997 |
| JP | A 10-017394 | 1/1998 |
| JP | A 10-107216 | 4/1998 |
| JP | A 10-265948 | 10/1998 |
| JP | A 11-026296 | 1/1999 |

(Continued)

OTHER PUBLICATIONS

Fork et al., "Epitaxial yttria–stabilized zirconia on hydrogen–terminated Si by pulsed laser deposition", Appl. Phys. Letter 57, Sep. 10, 1990, pp 1137–1139.

(Continued)

Primary Examiner—David Nelms
Assistant Examiner—David Vu
(74) Attorney, Agent, or Firm—Oliff & Berridge, PLC

(57) ABSTRACT

There is provided a substrate for electronic devices, in which treatment for forming a reconstructed surface or a hydrogen-terminated surface on a substrate is not necessary, and a buffer layer formed on the substrate can be epitaxially grown in the (100) orientation, and a manufacturing method therefor. The substrate 100 for electronic devices comprises; a substrate 11 consisting of silicon, and a first buffer layer 12 and a second buffer layer 13 having a fluorite structure, a first oxide electrode layer 14 having a layered perovskite structure, and a second oxide electrode layer 15 having a simple perovskite structure, which are epitaxially grown and laminated in this order on a film-forming surface of the substrate 11. The first buffer layer 12 is grown epitaxially at a higher rate than the growth rate of $SiO_2$, by irradiating a metallic plasma onto a natural oxide film in an SiO sublimation area.

11 Claims, 11 Drawing Sheets

FOREIGN PATENT DOCUMENTS

| JP | A 2000-101345 | 4/2000 |
| --- | --- | --- |
| JP | A 2000-332569 | 11/2000 |
| JP | A 2001-077102 | 3/2001 |
| JP | A 2001-122698 | 5/2001 |
| JP | A 2002-009358 | 1/2002 |

OTHER PUBLICATIONS

Haakenaasen et al., "High quality crystalline $YBa_2Cu_3O_{7\delta}$ films on thin silicon substrates", Appl. Phys. Lett. 64, Mar. 21, 1994, pp 1573–1575.

Hou et al., "Structure and properties of epitaxial $Ba_{0.5}Sr_{0.5}TiO_3/SrRuO_3/ZrO_2$ heterostructure on Si grown by off–axis sputtering", Appl. Phys. Lett. 67, Sep. 4, 1005, pp 1387–1389.

Pignolet A., et al., "Large Area Pulsed Laser Deposition of Aurivillus–type Layered Perovskite Thin Films", Ferrorelectrics, Overseas Published Associations, Amsterdam, NL, , vol. 202, No. 1–4, 1997, pp. 285–298.

Mechin L. et al., "A combined x–ray specular reflectivity and spectroscopic ellipsometry study of $CeO_2$/yttria–stabilized–zirconia bilayers on Si(100) substrates", Journal of Applied Physics, American Institute of Physics, New York, US, vol. 84, No. 9, Nov. 1, 1998, pp. 4935–4940.

Matthee T., et al., "Orientation relationships of epitaxial oxide buffer layers on silicon (100) for high–temperature superconducting Yba2Cu307–x films", Applied Physics Letters USA, vol. 61, No. 10, Sep. 7, 1992, pp. 1240–1242.

* cited by examiner

Fluorite structure (Simple) perovskite structure

Oxygen defect type triple perovskite structure

● : Potassium (K)
○ : Oxygen (O)
Center of octahedron: nickel (Ni)

K2NiF4 structure

SUBSTRATE FOR ELECTRONIC DEVICES, MANUFACTURING METHOD THEREFOR, AND ELECTRONIC DEVICE

BACKGROUND OF THE INVENTION

1. Field of the Invention

The present invention relates to a substrate for electronic devices, a manufacturing method therefor, and an electronic device. More specifically, the substrate for electronic devices according to the present invention is preferably used for mounting thereon a ferroelectric element functioning as a capacitor, a piezoelectric element functioning as a cantilever, or the like.

2. Description of the Related Art

Recently, the development of ferroelectric memories, being non-volatile memories using a ferroelectric, is proceeding rapidly. Ferroelectric memories are divided into; a capacitor type using a ferroelectric as a capacitor, formed in a 1T (transistor)/1C (capacitor) structure, and an MFSFET (Metal Ferroelectric Semiconductor Field Effect Transistor) type using a ferroelectric as a gate insulating film for a field-effect transistor instead of $SiO_2$. The MFSFET type is more advantageous than the capacitor type in view of high integration and non-destructive reading, but it has not yet been realized due to difficulty in manufacturing related to the structure. Hence, development and commercialization of the capacitor type is ahead at present.

Representative ferroelectric materials adopted in the capacitor type ferroelectric memory include $PbZr_{1-x}Ti_xO_3$ (abbreviated as PZT) and $SrBi_2Ta_2O_9$ (abbreviated as SBT). Of these, the PZT having a composition near a rhombohedral and tetragonal phase boundary (Morphotropic Phase Boundary; abbreviated as MPB) has excellent remanence and anti-field characteristic, and is put to practical use.

The capacitor type ferroelectric memory has a structure in which the ferroelectric material PZT, is placed between a lower electrode and an upper electrode. Pt has heretofore been used as a material forming the lower electrode. Having a face-centered cubic lattice structure, which is the closest packing structure, Pt has strong self-orientation, and is oriented in a cubic (111) direction even on a thin film having an amorphous structure, such as $SiO_2$ and is hence used preferably. However, since Pt has strong orientation, when columnar crystals grow, there are problems in that Pb or the like is likely to diffuse in the foundation along the grain boundary, and the bond between Pt and $SiO_2$ becomes poor. As one example of measures against the problems, Ti is used for improving the bond between Pt and $SiO_2$, and TiN is used for preventing Pb from diffusing, in many cases. However, when Ti or TiN is used, the lower electrode has a complicated electrode structure, causing oxidation of Ti and diffusion of Ti into Pt, accompanied with deterioration in crystallinity of PZT. As a result, deterioration in polarization-electric field (P-E) characteristic, leak current characteristic and fatigue characteristic (tolerance to repeated write) may be caused.

In order to avoid various problems when Pt is used as the lower electrode, research for using conductive oxides, as represented by $RuO_x$ and $IrO_2$, for the lower electrode material has been conducted. Among these materials, $SrRuO_3$ having a perovskite structure has the same crystalline structure as that of PZT, and hence has excellent bondability on the interface and excellent characteristic as a diffusion barrier layer for Pb, and can easily realize the epitaxial growth of PZT. Therefore research into ferroelectric capacitors using $SrRuO_3$ for the lower electrode is being actively conducted.

However, in the case of the ferroelectric capacitor having a construction where an oxide having a perovskite structure, such as $SrRuO_3$, is used for the lower electrode, and PZT is provided thereon as a ferroelectric, there are problems as described below.

It is important for PZT to have a composition with more Ti than MPB which has a composition of Zr:Ti=0.52:0.48, for example, a composition of Zr:Ti=0.3:0.7, from a standpoint of an increase in remanence $P_r$ and a decrease in the anti-electric field $E_c$. However, PZT in this composition range exhibits a tetragonal, and the polarization direction thereof is parallel with the C-axis. As a result, in a ferroelectric capacitor having a structure in which a lower electrode, a ferroelectric and an upper electrode are laminated in this order on a substrate, it is necessary to orient the $SrRuO_3$ electrode itself, being the lower electrode, pseudocubically (100), in order to allow the PZT forming the ferroelectric layer to be a (001) oriented film.

However, when an electrode consisting of $SrRuO_3$, being a perovskite type oxide, is directly deposited on an Si substrate, an $SiO_2$ layer is formed on the interface therebetween. Hence, it is difficult to grow $SrRuO_3$ epitaxially. Therefore, there has been studied a method in which some kind of buffer layer is grown epitaxially on the Si substrate beforehand, and an $SrRuO_3$ electrode is grown epitaxially on the buffer layer (for example, see Patent Document 1).

Here the buffer layer epitaxially grown on the Si substrate includes oxides having a fluorite structure, such as yttria stabilized zirconia (abbreviation: YSZ, $Zr_{1-x}Y_xO_{2-0.5x}$) and $CeO_2$. These materials have been reported, for example, in non-patent document 1 for YSZ, and in non-patent document 2 for $CeO_2$/YSZ.

(Patent Document 1)
Japanese Unexamined Patent Application, First Publication No. 2001-122698
(Non-Patent Document 1)
Appl. Phys. Lett., vol. 57 (1990) 1137
(Non-Patent Document 2)
Appl. Phys. Lett., vol. 64 (1994) 1573

The present inventors have conducted research and development for a case where a YSZ buffer layer is used, and the $SrRuO_3$ electrode is grown epitaxially thereon, and as a result, it has been found that this structure has two problems described below.

The first problem is that in order to grow a buffer layer such as YSZ and $CeO_2$ on the Si substrate epitaxially, predetermined surface treatment is necessary with respect to a film-forming surface of the Si substrate, before deposition of the buffer layer thereon. Conventionally, as this surface treatment method, two methods are well known, that is, a method of forming a reconstructed surface, and a method of forming a hydrogen-terminated surface. For example, a technique in which a surface of the Si substrate is changed to a hydrogen-terminated surface, by subjecting the surface of the Si substrate to a treatment by hydrofluoric acid is disclosed in non-patent document 3. Here, the reconstructed surface represents a surface in which the periodic structure of the surface has been changed to bulk, by performing heat treatment in a high temperature and high vacuum atmosphere, so as to allow excessive covalent bonds (dangling bonds) in Si atoms forming the surface layer of the Si substrate to bond with each other. On the other hand, the hydrogen-terminated surface stands for a surface having a structure in which after an SiO natural oxide film forming the surface layer of the Si substrate is etched by washing with hydrofluoric acid, the dangling bonds on the surface are terminated with hydrogen in ammonium fluoride solution.

(Non-Patent Document 3)

Appl. Phys. Lett., vol. 57 (1990) 1137

The second problem is that the orientation direction of $SrRuO_3$ formed on the buffer layer changes to the (110) orientation (pseudo-cubic). It is well-known that when $SrRuO_3$ having a simple perovskite structure (in orthorhombic, a=0.5567 nm, b=0.5530 nm, c=0.7845 nm, and in pseudo-cubic, a=0.3923 nm, $2^{1/2}$a=0.5548 nm) is provided on the (100) surface of YSZ (a=0.514 nm) or $CeO_2$ (a=0.541 nm) having a fluorite structure, epitaxial growth does not occur in the (100) orientation, but is (110) oriented (pseudo-cubically) (for example, see non-patent document 4)

(Non-Patent Document 4)

Appl. Phys. Lett., vol. 67 (1995) 1387

In other words, in order to epitaxially grow the buffer layer such as YSZ or $CeO_2$ on the Si substrate, predetermined surface treatment has heretofore been required with respect to the film-forming surface of the Si substrate, before deposition of the buffer layer thereon, thereby causing complication of the manufacturing process and an increase in the manufacturing cost. Even if such predetermined surface treatment is conducted, the epitaxial growth of the buffer layer formed thereon cannot be realized in the desired (100) orientation, but only the epitaxial growth in the (110) orientation can be realized.

SUMMARY OF THE INVENTION

In view of the above situation, it is an object of the present invention to provide a substrate for electronic devices, in which when a buffer layer such as YSZ and $CeO_2$ is grown epitaxially on an Si substrate, predetermined surface treatment, that is, treatment for forming a reconstructed surface or treatment for forming a hydrogen-terminated surface is not necessary with respect to the film-forming surface of the Si substrate, before deposition of the buffer layer thereon, and even if the predetermined surface treatment is not performed, the buffer layer can be epitaxially grown in the (100) orientation, and a manufacturing method therefor.

In order to solve the above problems, the present invention provides a substrate for electronic devices comprising: a substrate consisting of silicon, and a first buffer layer, a second buffer layer, a first oxide electrode layer and a second oxide electrode layer, which are grown epitaxially and laminated in this order on the film-forming surface of the substrate, wherein the first buffer layer is a first metal oxide having a fluorite structure, the second buffer layer is a second metal oxide having a fluorite structure, the first oxide electrode layer is a third metal oxide having a layered perovskite structure, and the second oxide electrode layer is a fourth metal oxide having a simple perovskite structure.

Moreover, the present invention provides a manufacturing method for the substrate for electronic devices, comprising:

a pretreatment step for washing a substrate consisting of silicon;

a first film-forming step in which the substrate having been subjected to the pretreatment step is arranged in a film-forming container under a reduced-pressure atmosphere, and a predetermined gas or plasma is irradiated onto the film-forming surface of the substrate, to epitaxially grow a first buffer layer comprising a first metal oxide having a fluorite structure;

a second film-forming step in which a predetermined gas or plasma is irradiated onto the surface of the first buffer layer, to epitaxially grow a second buffer layer comprising a second metal oxide having a fluorite structure;

a third film-forming step in which a predetermined gas or plasma is irradiated onto the surface of the second buffer layer, to epitaxially grow a first oxide electrode layer comprising a third metal oxide having a layered perovskite structure; and a fourth film-forming step in which a predetermined gas or plasma is irradiated onto the surface of the first oxide electrode layer, to epitaxially grow a second oxide electrode layer comprising a fourth metal oxide having a simple perovskite structure.

As described above, according to the present invention, there is provided a substrate for electronic devices having a construction such that the first buffer layer and the second buffer layer having the fluorite structure are grown epitaxially in the cubic (100) orientation on the Si substrate, the first oxide electrode layer having the layered perovskite structure is grown epitaxially in a tetragonal or orthorhombic (001) orientation thereon, and the second oxide electrode layer having the simple perovskite structure is grown epitaxially in a cubic or pseudo-cubic (100) orientation thereon.

In the substrate for electronic devices, since the outermost surface is the (100) oriented second oxide electrode layer, when a ferroelectric layer or a piezoelectric layer having the perovskite structure is formed thereon, the epitaxial growth of the ferroelectric layer or the piezoelectric layer can be realized easily in the tetragonal (001) orientation or a rhombohedral (100) orientation.

Consequently, using the substrate for electronic devices according to the present invention, electronic devices provided with functional elements such as a ferroelectric memory or a piezoelectric element formed by providing a ferroelectric layer or a piezoelectric layer on the substrate, can be made with an optimal construction.

According to the manufacturing method of the present invention, when the first buffer layer having the fluorite structure is formed on the Si substrate, the first buffer layer is grown epitaxially at a higher rate than the growth rate of $SiO_2$, by irradiating a metallic element gas or plasma onto the Si substrate coated with a natural oxide film in an SiO sublimation area, so that the first buffer layer can be formed, without forming a thermally oxidized amorphous layer between the Si substrate and the first buffer layer. As a result, the first buffer layer having a desired oriented plane and excellent crystallinity can be formed, thereby enabling the second buffer layer, the first oxide electrode layer and the second oxide electrode layer formed on the first buffer layer to have excellent crystallinity. As a result, a substrate for electronic devices enabling production of high performance electronic devices can be manufactured.

DETAILED DESCRIPTION OF THE INVENTION

The substrate for electronic devices according to the present invention will be described in detail below, with reference to the drawings.

Figure 1:
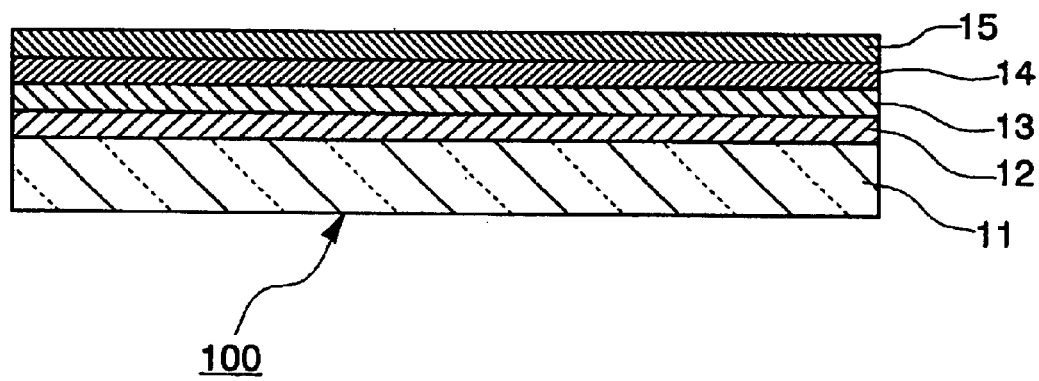
FIG. 1 is a schematic sectional view illustrating a configuration of a substrate for electronic devices according to the present invention.

FIG. 1 is a schematic sectional view of the substrate for electronic devices according to the present invention. In FIG. 1, the substrate 100 for electronic devices comprises a substrate 11 consisting of silicon, and a first buffer layer 12, a second buffer layer 13, a first oxide electrode layer 14 and a second oxide electrode layer epitaxially grown and laminated in this order on a film-forming surface of the substrate 11. The first buffer layer 12 is a first metal oxide having a fluorite structure, the second buffer layer 13 is a second metal oxide having a fluorite structure, the first oxide electrode layer 14 is a third metal oxide having a layered perovskite structure, and the second oxide electrode layer 15 is a fourth metal oxide having a simple perovskite structure.

Figure 2A:
FIGS. 2A to 2E are sectional views in each manufacturing step, when the substrate for electronic devices according to the present invention is manufactured.
Figure 2B:
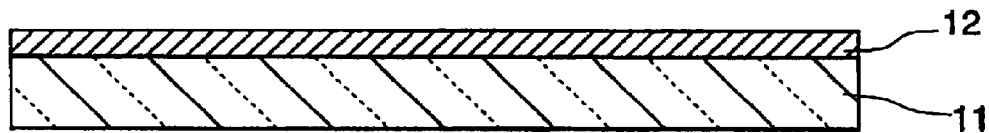
Figure 2C:
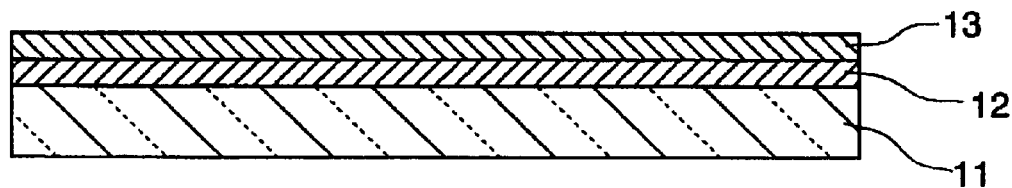
Figure 2D:
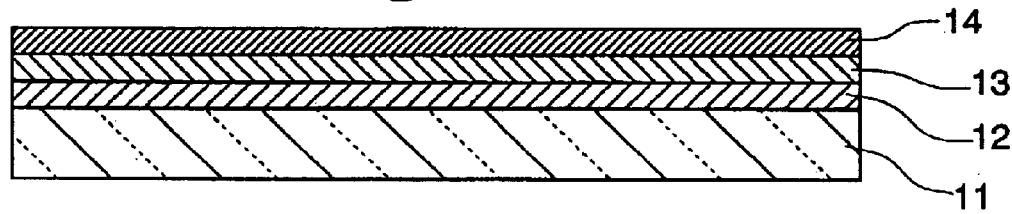
Figure 2E:
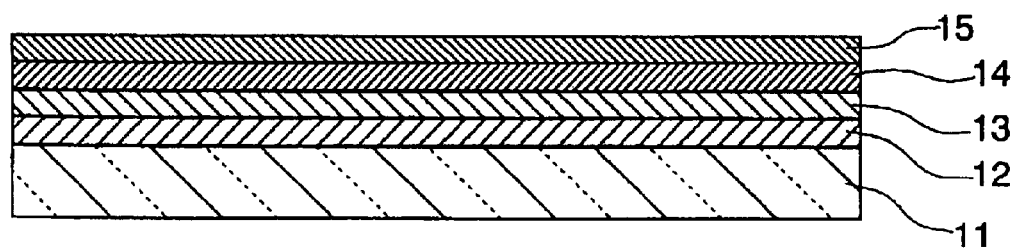

FIGS. 2A to 2E are schematic sectional views illustrating states in which the first buffer layer 12, the second buffer layer 13, the first oxide electrode layer 14 and the second oxide electrode layer 15 are sequentially laminated on the substrate 11, when the substrate for electronic devices in FIG. 1 is manufactured. FIG. 2A illustrates the substrate 11 immediately before the first buffer layer 12 is provided, indicating that an oxide layer 16 exists on the film-forming surface. FIG. 2B represents the state where the first buffer layer 12 is provided, FIG. 2C represents the state where second buffer layer 13 is provided, FIG. 2D represents the state where the first oxide electrode layer 14 is provided, and FIG. 2E represents the state where the second oxide electrode layer 15 is provided.

In the case of the substrate 100 for electronic devices having the above configuration, the first metal oxide having the fluorite structure is first provided as the first buffer layer 12, on the film-forming surface of the substrate 11 consisting of silicon. So long as this is the first metal oxide having the fluorite structure, then even if the film-forming surface of the substrate 11 consisting of silicon has not been subjected to predetermined surface treatment, that is, the treatment for forming a reconstructed surface or the treatment for forming a hydrogen-terminated surface, epitaxial growth of the first buffer layer 12 comprising the first metal oxide becomes possible.

This is because since the predetermined surface treatment has not been conducted with respect to the film-forming surface of the substrate 11, oxygen remains on the film-forming surface of the substrate 11, with the film-forming surface of the substrate 11 covered with $SiO_2$, and on adherence of the metal oxide thereon, oxygen disengages from the film-forming surface of the substrate 11 in the form of SiO, and as a result, the first buffer layer 12 grows epitaxially.

Figure 9:
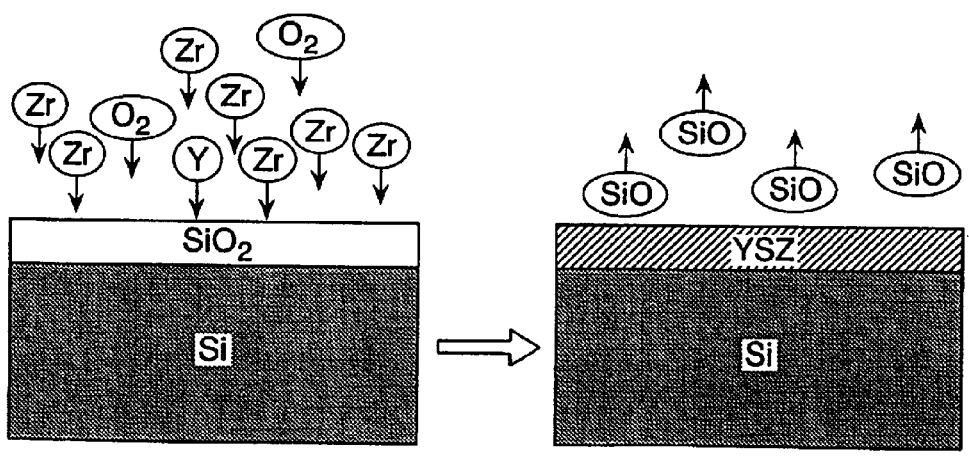
FIG. 9 is a schematic sectional view illustrating an outline for forming a first buffer layer on the substrate, on the film-forming surface of which an oxide layer exists.

FIG. 9 is a schematic sectional view illustrating this situation. In FIG. 9, the left figure represents the state in which oxygen remains on the film-forming surface of the substrate 11, with the film-forming surface of the substrate 11 covered with $SiO_2$. In FIG. 9, the right figure represents the state in which on adherence of the metal oxide thereon, oxygen disengages from the film-forming surface of the substrate 11 in the form of SiO, and as a result, YSZ grows epitaxially as the first buffer layer 12.

Figure 10:
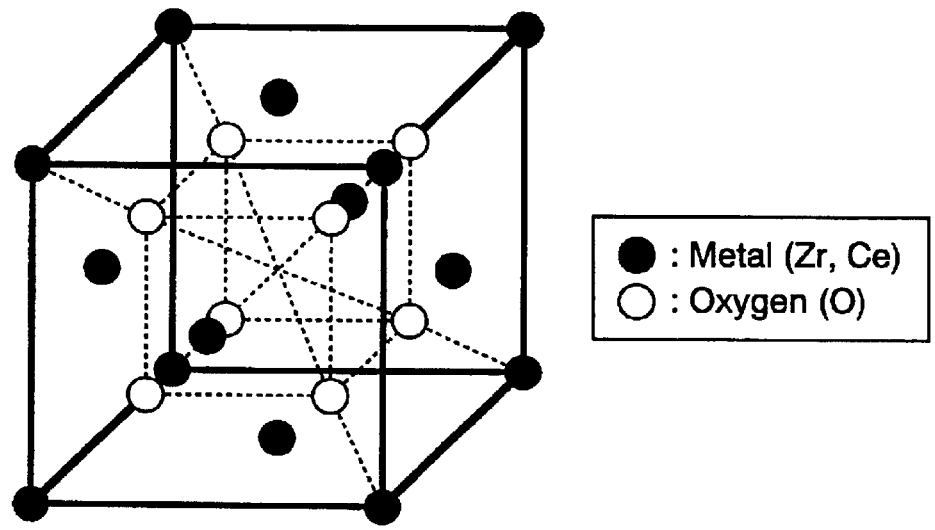
FIG. 10 is a schematic perspective view illustrating one example of a fluorite structure.

The present inventors have found by experiments that the material by which the above phenomenon can be confirmed is a metal oxide having the fluorite structure. For example, the fluorite structure is as shown in FIG. 10. In this application, the metal oxide forming the first buffer layer 12 is referred to as a first metal oxide. It has been confirmed by X-ray photoelectron spectroscopy (abbreviated as XPS) that oxygen remains on the film-forming surface of the substrate 11, which has not undergone the predetermined surface treatment.

The present inventors have confirmed by experiments that the above phenomenon occurs when the orientation of the film-forming surface of the substrate 11 consisting of silicon is (100), (110) or (111).

Moreover, they found that the film-forming surface of the substrate 11 consisting of silicon when the above phenomenon occurs, that is, the film-forming surface that has not been subjected to the predetermined surface treatment, such as the treatment for forming a reconstructed surface or the treatment for forming a hydrogen-terminated surface, can be specified, since a diffraction pattern is not observed in a diffraction image by the RHEED method, before forming the first buffer layer.

Figure 3A:
FIGS. 3A to 3E are photographs showing diffraction patterns obtained by observing the outermost surface in each manufacturing step, when the substrate for electronic devices according to the present invention is manufactured, using an RHEED method.

FIGS. 3A to 3E are photographs of diffraction images observed by the RHEED method. FIG. 3A shows the result of observing the surface where the oxide layer 16 exists on the substrate 11, immediately before the first buffer layer 12 is formed. FIG. 3B to FIG. 3E respectively show the results of observation of the surfaces of the first buffer layer 12, the second buffer layer 13, the first oxide electrode layer 14, and the second oxide electrode layer 15.

From FIG. 3A, it is clearly seen that when observing the surface on which the oxide layer 16 exists on the substrate 11 immediately before providing the first buffer layer 12, the diffraction pattern is not observed. When the first buffer layer 12, the second buffer layer 13, the first oxide electrode layer 14, and the second oxide electrode layer 15 are sequentially laminated on the film-forming surface of the substrate in such a condition, the diffraction pattern can be observed gradually becoming distinct in the diffraction image by the reflection high energy electron diffraction (abbreviated as RHEED) method. The result of observation indicates the epitaxial growth of each layer formed by the sequential lamination.

In other words, on the epitaxially grown first buffer layer 12, the second buffer layer 13 comprising the second metal oxide having the fluorite structure, the first oxide electrode layer 14 comprising the third metal oxide having the layered perovskite structure, and the second oxide electrode layer 15 comprising the fourth metal oxide having the simple perovskite structure can be each grown epitaxially.

It becomes clear that if the layered perovskite structure is formed on the fluorite structure, and then the simple perovskite structure is provided on the layered perovskite structure, the second oxide electrode layer 15 laminated last can epitaxially grow in the (100) orientation, which has been a difficult orientation.

Figure 11:
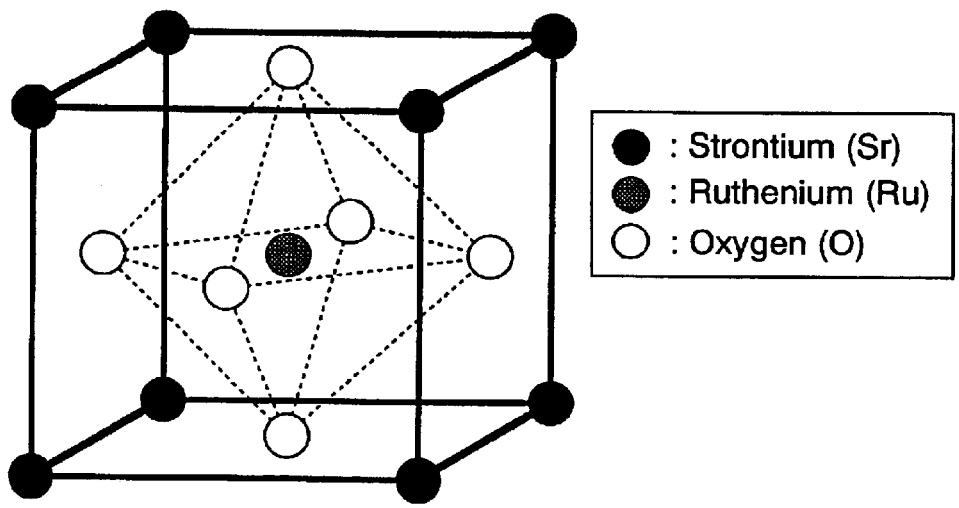
FIG. 11 is a schematic perspective view illustrating one example of a simple perovskite structure.
Figure 12:
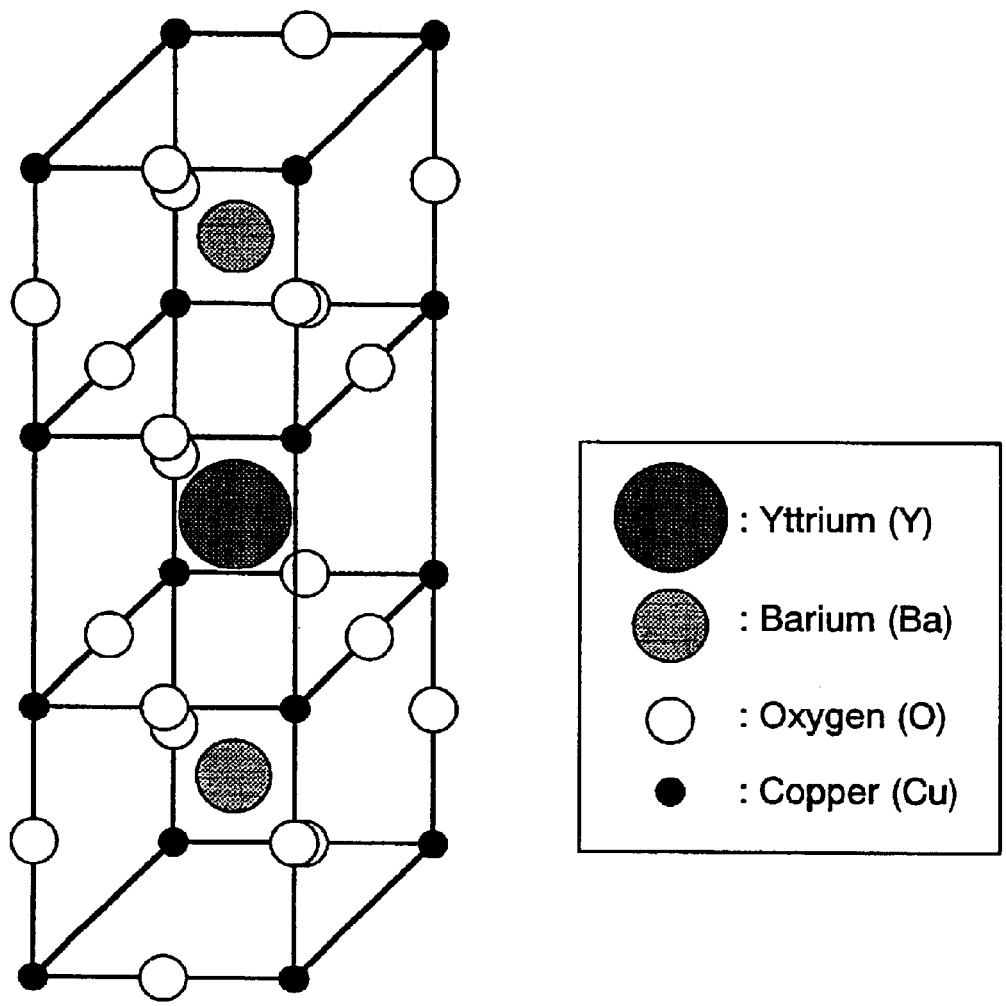
FIG. 12 is a schematic perspective view illustrating one example of a layered perovskite structure.
Figure 13:
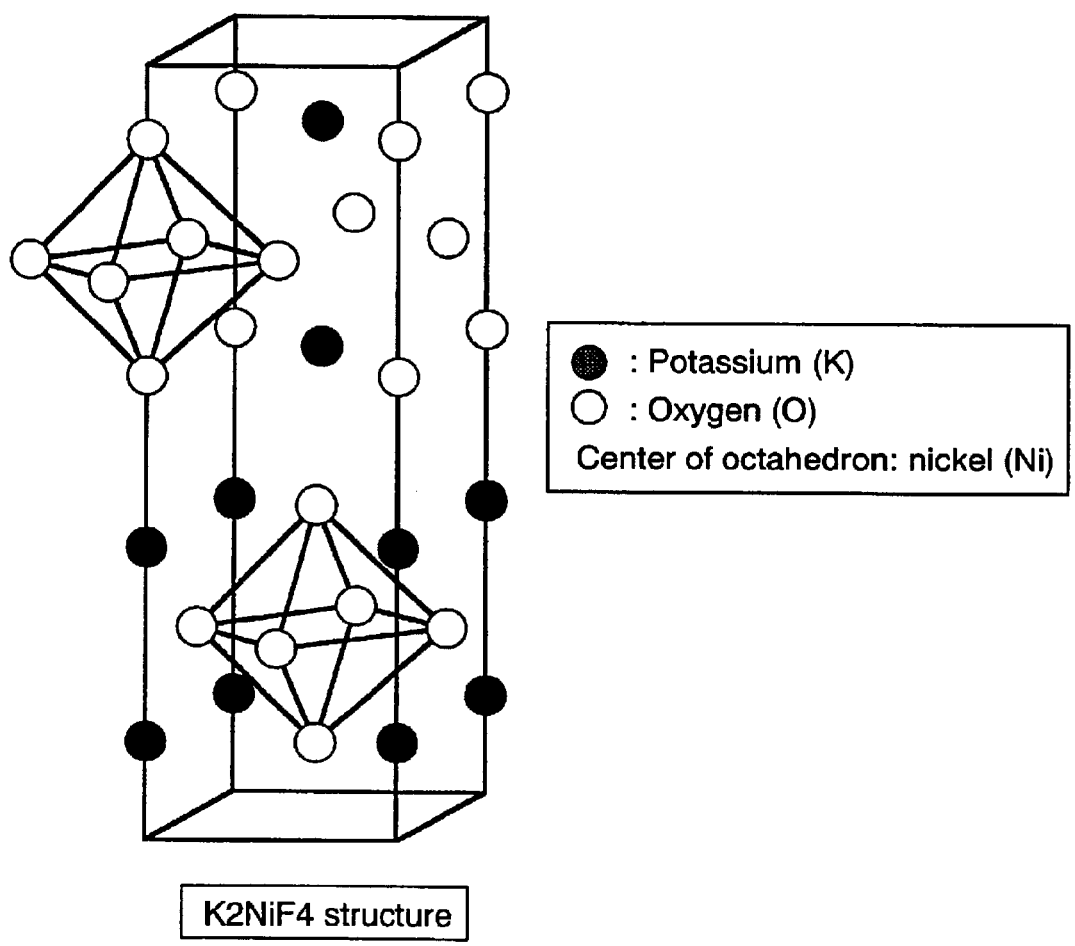
FIG. 13 is a schematic perspective view illustrating another example of a layered perovskite structure.

FIG. 11 illustrates an example of the simple perovskite structure, and FIG. 12 and FIG. 13 illustrate examples of the layered perovskite structure.

Since the substrate for electronic devices having the above configuration comprises an oxide electrode layer epitaxially grown in the (100) orientation on the outermost surface, the ferroelectric material comprising PZT or SBT can be grown as a (001) oriented film thereon. Therefore, the substrate for electronic devices according to the present invention is suitable as a substrate for manufacturing ferroelectric elements and piezoelectric elements.

The first metal oxide constituting the first buffer layer 12 is, for example, a solid solution expressed as $Zr_{1-x}M\alpha_xO_y$ (0<x<1, 1.5<y<2) obtained by substituting a part of Zr, being a constituent element of zirconia, by a metal element Mα (where Mα indicates one kind of element selected from La, Ce, Pr, Nd, Pm, Sm, Eu, Gd, Tb, Dy, Ho, Er, Tm, Yb, Lu, Y, Mg, Ca, Sr and Ba), and is preferably cubically oriented in the (100) direction.

The second metal oxide constituting the second buffer layer 13 is cerium oxide or a solid solution expressed as $Ce_{1-x}M\beta_xO_y$ (0<x<1, 1.5<y<2) obtained by substituting a part of Ce, being a constituent element of cerium oxide, by a metal element Mβ (where Mβ indicates one kind of element selected from Zr, La, Pr, Nd, Pm, Sm, Eu, Gd, Tb, Dy, Ho, Er, Tm, Yb, Lu, Y, Mg, Ca, Sr and Ba), and is preferably cubically oriented in the (100) direction.

The third metal oxide constituting the first oxide electrode layer 14 is a solid solution containing a metal element Mγ or RE as a constituent element, and expressed as $M\gamma RuO_4$, $RE_2NiO_4$, or $REBa_2Cu_3O_x$ (where Mγ indicates one kind of element selected from Ca, Sr and Ba, and RE indicates one kind of element selected from La, Ce, Pi, Nd, Pm, Sm, Eu, Gd, Tb, Dy, Ho, Er, Tm, Yb, Lu, and Y), and is preferably tetragonally or orthorhombically oriented in the (001) direction.

The fourth metal oxide constituting the second oxide electrode layer 15 is a solid solution containing a metal element Mγ or RE as a constituent element, and expressed as $M\gamma RuO_3$, (RE, Mγ)$CrO_3$, (RE, Mγ)$MnO_3$, (RE, Mγ)$CoO_3$, or (RE, Mγ)$NiO_3$ (where Mγ indicates one kind of element selected from Ca, Sr and Ba, and RE indicates one kind of element selected from La, Ce, Pr, Nd, Pm, Sm, Eu, Gd, Tb, Dy, Ho, Er, Tm, Yb, Lu, and Y), and is preferably cubically or pseudo-cubically oriented in the (100) direction.

Figure 7:
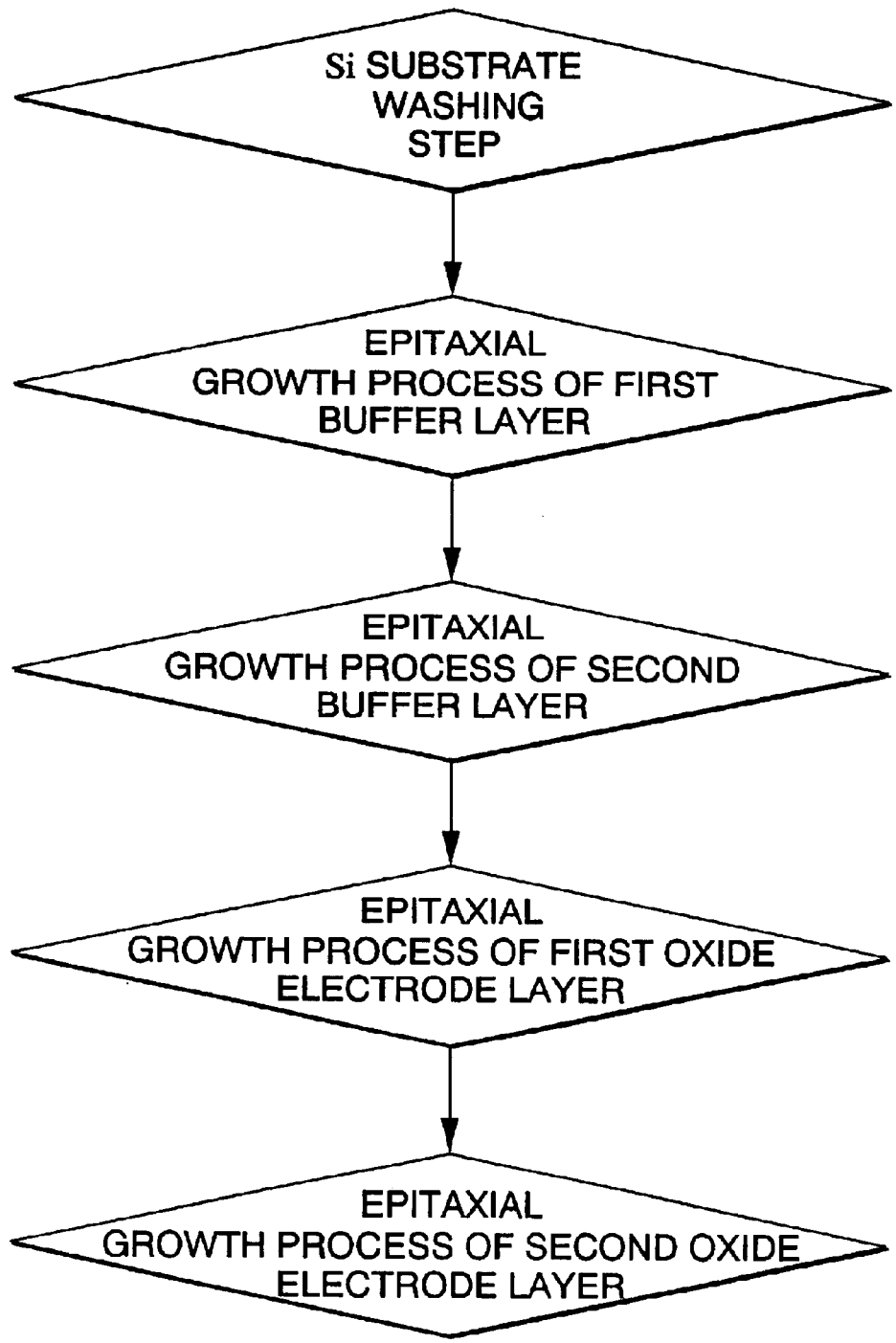
FIG. 7 is a flowchart for each step constituting a manufacturing method for a substrate for electronic devices according to the present invention.

FIG. 7 is a flowchart for each step constituting a manufacturing method for a substrate for electronic devices according to the present invention.

The manufacturing method for a substrate for electronic devices according to the present invention comprises:

- a pretreatment step for washing the substrate 11 consisting of silicon (in FIG. 7, expressed as "Si substrate washing step");
- a first film-forming step in which the substrate 11 having been subjected to the pretreatment step is arranged in a film-forming container under a reduced-pressure atmosphere, and a predetermined gas or plasma is irradiated onto the film-forming surface of the substrate 11, to epitaxially grow the first buffer layer 12 comprising the first metal oxide having the fluorite structure (in FIG. 7, expressed as "epitaxial growth process of first buffer layer");
- a second film-forming step in which a predetermined gas or plasma is irradiated onto the surface of the first buffer layer 12, to epitaxially grow the second buffer layer 13 comprising the second metal oxide having a fluorite structure (in FIG. 7, expressed as "epitaxial growth process of second buffer layer");
- a third film-forming step in which a predetermined gas or plasma is irradiated onto the surface of the second buffer layer 13, to epitaxially grow the first oxide electrode layer 14 comprising the third metal oxide having the layered perovskite structure (in FIG. 7, expressed as "epitaxial growth process of first oxide electrode layer"); and
- a fourth film-forming step in which a predetermined gas or plasma is irradiated onto the surface of the first oxide electrode layer 14, to epitaxially grow the second oxide electrode layer 15 comprising the fourth metal oxide having the simple perovskite structure (in FIG. 7, expressed as "epitaxial growth process of second oxide electrode layer").

Figure 8:
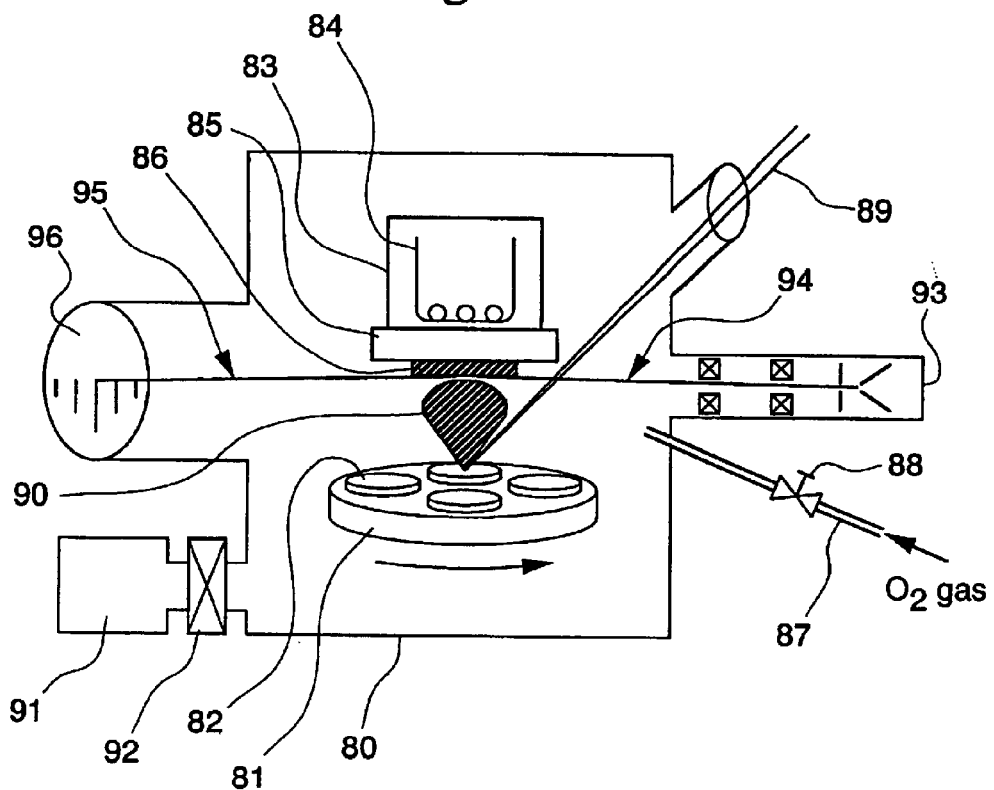
FIG. 8 is a schematic sectional view showing one example of a film-forming apparatus used for forming an oxide film constituting the substrate for electronic devices according to the present invention.

In the manufacturing method for the substrate for electronic devices, a film-forming apparatus shown in FIG. 8 is preferably used for the manufacturing apparatus which forms the respective oxide films in the first to the fourth film-forming steps. FIG. 8 is a schematic sectional view of the film-forming apparatus which forms a thin film by a pulsed laser deposition (PLD) method, wherein reference symbol 80 denotes a process chamber, whose inside can be decompressed, 81 denotes a rotatable base metal supporting section having film-forming base metals placed thereon, referred to as targets, 82 denotes a target placed on the base metal supporting section 81, 83 denotes a substrate holding section, 84 denotes a temperature control section built into the substrate holding section 83, 85 denotes a substrate, 86 denotes a thin film deposited on the substrate 85, 87 denotes an introduction pipe for a process gas, 88 denotes an opening and closing mechanism for controlling the process gas, 89 denotes an (ArF or KrF) excimer laser beam irradiated onto the film-forming base metal 82, 90 denotes a plume (plasma column) generated by irradiating the excimer laser beam onto the film-forming base metal 82, 91 denotes an exhaust section which decompresses the inside of the process chamber 80, 92 denotes an opening and closing mechanism which shuts off the inside space of the process chamber 80 from the inside space of the exhaust section 91, 93 denotes a RHEED source (RHEED gun) used at the time of analyzing the thin film by the RHEED method, 94 denotes a beam shone onto the thin film 86 from the RHEED source 93, 95 denotes a beam reflected by the thin film 86, and 96 denotes a mechanism which detects the reflected beam 95, referred to as a RHEED screen.

The PLD method used in the film-forming apparatus shown in FIG. 8 is a film-forming method in which an excimer laser beam is irradiated onto a rotating target in the form of pulses, in an oxygen atmosphere in which the inside space of the process chamber 80 is kept at a very low pressure, for example, at a pressure of about 1/1000 of atmospheric pressure, while forming the thin film 86 on the substrate 85, so that the component constituting the target is made fly to the substrate in a plasma or molecular state by this irradiation, thereby depositing the thin film on the film-forming surface of the substrate.

In the manufacturing method for the substrate for electronic devices having this configuration, the pretreatment step stands for washing treatment for removing organics from the surface layer of the substrate 11 consisting of silicon, and drying treatment conducted thereafter. In this washing treatment, for example, the substrate 11 is soaked in an organic solvent, or ultrasonic waves are applied simultaneously with soaking, to remove organics adhered to the substrate 11. The drying treatment is for removing the organic solvent used in the washing treatment, from the film-forming surface of the substrate 11.

At this time, in this pretreatment step, it is desired to finish the film-forming surface of the substrate 11 as a surface where the oxide layer 16 exists, not as a reconstructed surface or a hydrogen-terminated surface. Specifically, the RCA washing or washing with hydrofluoric acid for obtaining the reconstructed surface or the hydrogen-terminated surface, which has been heretofore conducted after the washing treatment using the organic solvent, is not conducted, so as to finish the film-forming surface of the substrate 11 in a state with oxygen (oxide layer 16) remaining thereon (FIG. 2A).

In the first film-forming step, the substrate 11 having undergone the pretreatment step is arranged in a film-forming container under a reduced-pressure atmosphere, and a predetermined gas or plasma is irradiated onto the film-forming surface of the substrate 11, to epitaxially grow the first buffer layer 12 comprising the first metal oxide having the fluorite structure. Here the predetermined gas or plasma comprises an element constituting the metal oxide to be formed in the first film-forming step, and this is irradiated onto the film-forming surface of the substrate 11.

Oxygen (the oxide layer 16) remains on the film-forming surface of the substrate 11 produced in the pretreatment step, and the film-forming surface is covered with $SiO_2$. Therefore, when this film-forming surface is exposed to the gas or plasma comprising the element constituting the metal oxide, the element adheres to the film-forming surface, so that the metal oxide starts to deposite, and at the same time, the $SiO_2$ film forming the oxide layer 16 existing on the film-forming surface is sublimated in the form of SiO and removed from the film-forming surface struck by the gas or plasma. At the time of removing SiO, the substrate 11 is held under a temperature, a back pressure, and an oxygen partial pressure such that the vapor pressure of SiO does not reach the saturated vapor pressure, and the deposition rate of the first buffer layer 12 is set to not lower than a growth rate of the thermally oxidized $SiO_2$ film on the film-forming surface of the substrate 11.

By this action, a silicon oxide hardly exists on the interface between the substrate 11 consisting of silicon and the first buffer layer 12, so that the epitaxially grown first buffer layer 12 can be provided directly on the film-forming surface of the substrate 11 (FIG. 2B). The metal oxide having the fluorite structure is preferably used for the first buffer layer, since the above action can be stably obtained.

When the first buffer layer 12 is formed, the first film-forming step is carried out under film-forming conditions such that the temperature of the substrate 11 is 800° C. or lower, the back pressure in the film-forming atmosphere is not lower than $1 \times 10^{-6}$ Torr, and the oxygen partial pressure in the film-forming atmosphere is not lower than $5 \times 10^{-6}$ Torr, and more preferably, under film-forming conditions such that the temperature of the substrate 11 is from 600° C. to 800° C. inclusive, the back pressure in the film-forming atmosphere is from $1 \times 10^{-6}$ Torr to $5 \times 10^{-6}$ Torr inclusive, and the oxygen partial pressure in the film-forming atmosphere is from $5 \times 10^{-6}$ Torr to $5 \times 10^{-4}$ Torr inclusive (1 Torr=133 Pa).

Moreover, the deposition rate of the first buffer layer 12 is preferably set to not lower than the growth rate (0.2 nm/min.) of the thermally oxidized $SiO_2$ film. One example of the film-forming conditions for obtaining this deposition rate is such that the density of the laser energy is not lower than 1 J/cm$^2$, the laser frequency is not lower than 5 Hz, and the target-substrate distance is from 50 mm to 80 mm inclusive.

Here, it is important to set the deposition rate of the first buffer layer 12 to not lower than the growth rate (0.2 nm/min.) of the thermally oxidized $SiO_2$ film. This is because, from a verification experiment by the present inventors relating to the relation between the deposition rate and the crystallinity of the first buffer layer, it was found that when the deposition rate was lower than 0.2 nm/min, which is the growth rate of the thermally oxidized $SiO_2$ film, the epitaxial growth of the first buffer layer 12 could not be achieved. The details of the verification experiment are described below.

The experiment was conducted by preparing a pretreated Si substrate, and forming a YSZ film on the Si substrate as the first buffer layer by the PLD method using the film-forming apparatus shown in FIG. 8. At this time, the deposition rate of YSZ was adjusted by variously changing the laser frequency, the target-substrate distance and the laser energy density. The respective experiment conditions, the deposition rate of YSZ, and the full width at half maximum (FWHM) in a rocking curve of a YSZ (200) peak obtained by measuring the formed YSZ by the XRD are shown in Table 1.

The substrate temperature at the time of film forming was 700° C., the back pressure in the film-forming atmosphere was $1 \times 10^{-6}$ Torr, and the oxygen partial pressure was $5 \times 10^{-5}$ Torr, which were common in all conditions.

Figure 14:
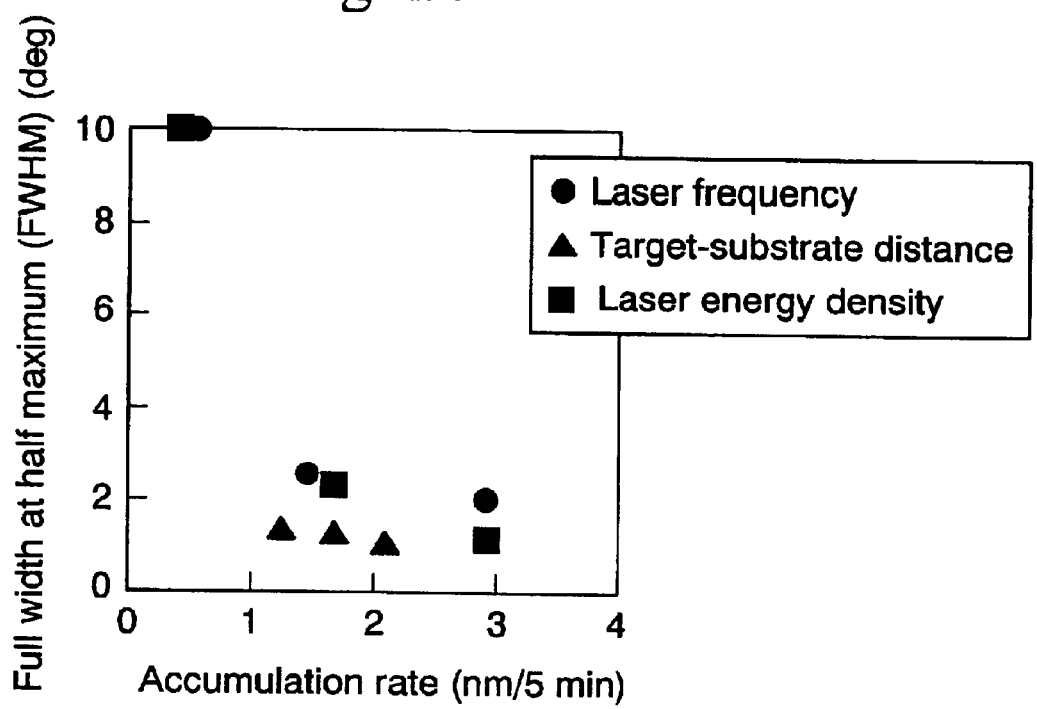
FIG. 14 is a graph illustrating a relation between an deposition rate of the first buffer layer and a peak half width of YSZ (200).

FIG. 14 is a graph in which the results shown in Table 1 are itemized for each parameter used for the adjustment of the deposition rate. In this graph, the deposition rate of YSZ is plotted on the X axis, and the peak half width of YSZ (200) is plotted on the Y axis. As is obvious from the results shown in Table 1 and FIG. 14, in the range where the deposition rate is lower than 0.2 nm/min. (1 nm/5 min.), the peak half width of YSZ (200) is extremely large, indicating that YSZ has not epitaxially grown. On the contrary, in the range where the deposition rate is not lower than 0.2 in/min., it is seen that the peak half width becomes narrow, and YSZ has epitaxially grown favorably.

Moreover, as shown in FIG. 14, since the relation between the deposition rate and the peak half width do not rely on the parameters used for the adjustment of the deposition rate, it is suggested that the reaction which inhibits the epitaxial growth of YSZ on the Si substrate progresses on the Si substrate. This deposition rate of 0.2 nm/min. substantially agrees with the deposition rate of the thermally oxidized $SiO_2$ film on the Si substrate, and the deposition process of YSZ is conducted in an oxygen-containing atmosphere by heating the substrate to a high temperature. Therefore, it can be presumed that the reaction inhibiting the epitaxial growth of YSZ is a reaction for forming the thermally oxidized $SiO_2$ film on the surface of the Si substrate.

From the above results, in the first film-forming step for forming the first buffer layer 12, it can be said that in order that the first buffer layer 12 is grown epitaxially, it is necessary to set the deposition rate thereof faster than the growth rate of the thermally oxidized $SiO_2$ film on the surface of the Si substrate.

TABLE 1

| Sample No. | Laser frequency (Hz) | Target-substrate distance (mm) | Laser energy density (J/cm$^2$) | YSZ deposition rate (nm/5 min.) | YSZ (200) peak half width (deg.) |
|---|---|---|---|---|---|
| 1 | 2 | 50 | 1.5 | 0.58 | 10 |
| 2 | 5 | 50 | 1.5 | 1.46 | 2.5 |
| 3 | 10 | 50 | 1.5 | 2.92 | 1.91 |
| 4 | 10 | 80 | 1.5 | 1.25 | 1.31 |
| 5 | 10 | 70 | 1.5 | 1.67 | 1.22 |
| 6 | 10 | 60 | 1.5 | 2.08 | 0.99 |
| 7 | 10 | 50 | 1.5 | 2.92 | 1.06 |
| 8 | 10 | 50 | 0.5 | 0.42 | 10 |
| 9 | 10 | 50 | 1.0 | 1.67 | 2.29 |
| 10 | 10 | 50 | 1.5 | 2.92 | 1.06 |

In the formation of the first buffer layer 12, since the above described action operates, it is not necessary to increase the substrate temperature more than necessary, or set the back pressure in the film-forming atmosphere to ultra-high vacuum. On the other hand, in the conventional process, a substrate having a film-forming surface comprising a reconstructed surface or a hydrogen-terminated surface is used, and the first buffer layer is formed thereon. In this case, in order to achieve the epitaxial growth of the first buffer layer, a substrate temperature exceeding 800° C. and a film-forming atmosphere in which the back pressure is lower than $1 \times 10^{-6}$ Torr are the essential conditions. Therefore, according to the first film-forming step of the present invention, the energy required for producing the first buffer layer 12 can be considerably reduced, thereby contributing to a reduction in the production cost.

In the second film-forming step, a predetermined gas or plasma is irradiated onto the surface of the first buffer layer 12 formed in the first film-forming step, to epitaxially grow the second buffer layer 13 comprising the second metal oxide having the fluorite structure.

For the second buffer layer 13, there is selected one comprising the second metal oxide, being a different material from that of the first metal oxide constituting the first buffer layer 12, and having an effect of stimulating the epitaxial growth of the first oxide electrode layer 14 to be laminated on the second buffer layer 13.

Depending on the film-forming condition, there may be a case in which droplet particles having a diameter of from 1 to 10 μm are generated on the surface of the first buffer layer 12 formed in the first film-forming step. In this case, the droplet particles may be removed by adding a step of wiping off the surface of the first buffer layer 12, using a flexible material or a member having a flexible structure. For example, when the droplet particles of about 100 to 1000 pcs./cm$^2$ exist before removal, the number thereof can be decreased up to 0.1 to 1 pcs/cm$^2$ after removal, by using a cotton bud as the above member. The removal of the droplet particles generated on the surface of the first buffer layer 12 stimulates the epitaxial growth of the second buffer layer 13 formed thereon, thereby contributing to ensure the flatness.

In the third film-forming step, a predetermined gas or plasma is irradiated onto the surface of the second buffer layer 13 formed in the second film-forming step, to epitaxially grow the first oxide electrode layer 14 comprising the third metal oxide having the layered perovskite structure.

Finally, in the fourth film-forming step, a predetermined gas or plasma is irradiated onto the surface of the first oxide electrode layer 14 formed in the third film-forming step, to epitaxially grow the second oxide electrode layer 15 comprising the fourth metal oxide having the simple perovskite structure.

Conventionally, there is used a structure in which the first oxide electrode layer 14 comprising the third metal oxide having the layered perovskite structure is not provided, but the second oxide electrode layer 15 comprising the fourth metal oxide having the simple perovskite structure is directly formed on the surface of the second buffer layer 12. In this conventional structure in which the simple perovskite structure is directly arranged without providing the layered perovskite structure, the outermost surface is oriented in the (110) direction.

On the other hand, in the manufacturing method of the substrate for electronic devices according to the present invention, by adopting the step where the simple perovskite structure is formed on the layered perovskite structure, an oxide electrode layer epitaxially grown in the (100) orientation can be formed on the outermost surface.

For the first oxide electrode layer 14, there is selected one comprising the third metal oxide, being a different material from that of the second metal oxide constituting the second buffer layer 13, and having an effect of stimulating the epitaxial growth of the second oxide electrode layer 15 to be laminated on the first oxide electrode layer 14.

For the second oxide electrode layer 15, one that epitaxially grows on the first oxide electrode layer 14, and is oriented in the (100) direction is selected.

In the aforementioned manufacturing method for a substrate for electronic devices, in each step of the first to the fourth film-forming steps, a predetermined gas or plasma comprising an element constituting the metal oxide to be formed ill each step is used.

Particularly, in the first film-forming step, when a gas or plasma generated by irradiating a laser beam onto a base metal arranged opposite to the film-forming surface of the substrate 11 is used as the predetermined gas or plasma, it is desired to irradiate the gas or plasma of the constituent element of the first buffer layer 12 onto the substrate 11 held under a temperature, a back pressure and an oxygen partial pressure such that the vapor pressure of SiO does not reach the saturated vapor pressure, so that an $SiO_2$ film forming the oxide layer 16 existing on the film-forming surface of the substrate 11 is reduced to Si. Moreover, it is desired that the first buffer layer 12 is deposited on the film-forming surface at an deposition rate not lower than the rate at which the thermally oxidized $SiO_2$ film is formed, while sublimating and removing the Si formed by reduction as SiO, so that the first buffer layer 12 is epitaxially grown, without forming an amorphous layer on the interface between the substrate 11 and the first buffer layer 12. If formed in this manner, the first buffer layer 12 having a desired orientation plane and excellent crystallinity can be formed, in a simple manufacturing process, which is also desirable from a standpoint of reducing the manufacturing cost.

The electronic device according to the present invention is a functional element furnished with the substrate for electronic devices having the above described configuration.

In other words, in the substrate for electronic devices having the above described configuration, since the outermost surface comprises an oxide electrode layer epitaxially grown in the (100) orientation, then when a ferroelectric layer constituting a functional element represented by a capacitor (ferroelectric element) or a cantilever (piezoelectric element) is directly provided thereon, the ferroelectric layer can achieve excellent crystal growth. Therefore, since desired characteristics can be stably obtained, as compared with the conventional method, by using a functional element furnished with the substrate for electronic devices according to the present invention, then this is preferable.

Figure 5:
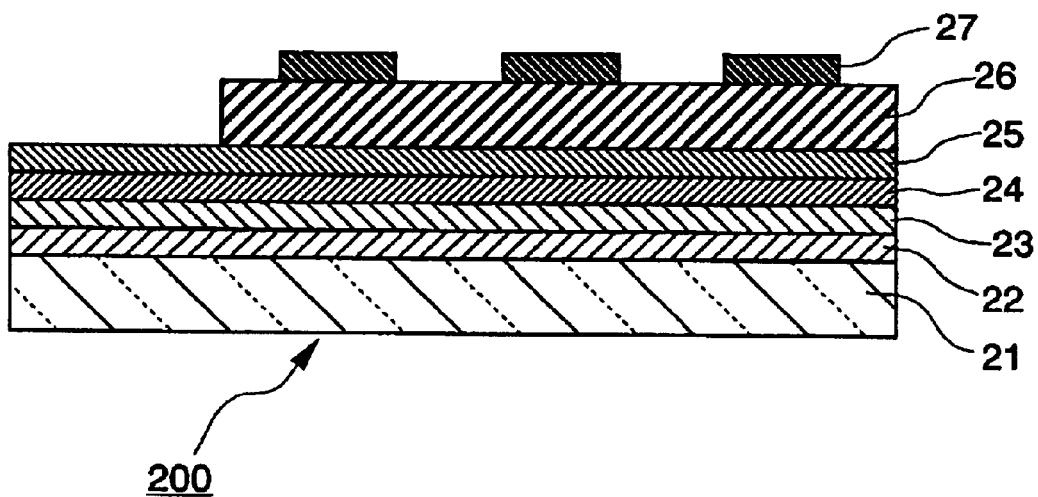
FIG. 5 is a sectional view schematically showing one example of a functional element constituting an electronic device according to the present invention.

FIG. 5 is a schematic sectional view illustrating one example of a functional element according to the present invention, wherein the functional element is a ferroelectric element (ferroelectric capacitor) 200. In FIG. 5, reference symbol 21 denotes a substrate consisting of silicon, 22 denotes a first buffer layer, 23 denotes a second buffer layer, 24 denotes a first lower electrode layer, 25 denotes a second lower electrode layer, 26 denotes a ferroelectric layer, and 27 denotes an upper electrode layer, with 21 to 25 corresponding to the above described substrate 100 for electronic devices.

Figure 6:
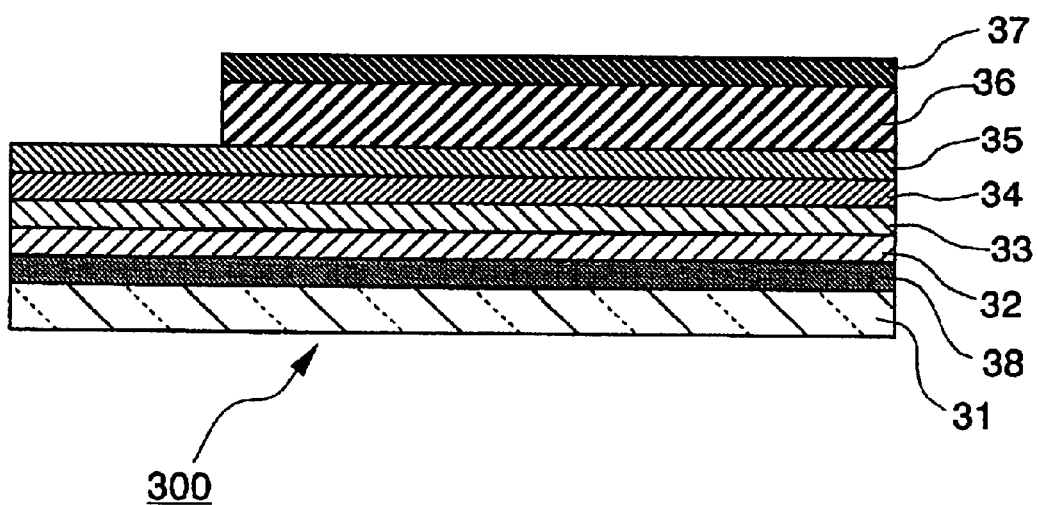
FIG. 6 is a sectional view schematically showing another example of a functional element constituting an electronic device according to the present invention.

FIG. 6 is a schematic sectional view illustrating another example of the functional element according to the present invention, wherein the functional element is a piezoelectric element (piezoelectric actuator) 300. In FIG. 6, reference symbol 31 denotes a substrate consisting of silicon, 32 denotes a first buffer layer, 33 denotes a second buffer layer, 34 denotes a first lower electrode layer, 35 denotes a second lower electrode layer, 36 denotes a piezoelectric layer, 37 denotes an upper electrode layer, and 38 denotes a thermal oxide film layer, with 31 to 35 including 38 corresponding to the above described substrate 100 for electronic devices.

EXAMPLES

The present invention will be described in detail by way of examples, but the present invention is not limited to these examples.

Example 1

In this example, a specific example of the substrate for electronic devices having a configuration in which a first buffer layer 12, a second buffer layer 13, a first oxide electrode layer 14 and a second oxide electrode layer 15 are sequentially laminated on a silicon substrate 11, with a film-forming surface being a (100) plane, and the manufacturing method therefor will be described, with reference to FIG. 1 to FIG. 4.

Figure 3B:
Figure 3C:
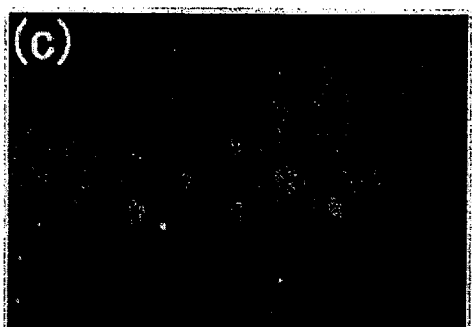

FIG. 1 is a schematic sectional view illustrating the configuration of the substrate for electronic devices according to this example, and FIG. 2 is a sectional view in each manufacturing step, when the substrate for electronic devices in FIG. 1 is manufactured. FIGS. 3A to 3E are photographs showing diffraction patterns obtained by observing the outermost surface in each manufacturing step, when the substrate for electronic devices in FIG. 1 is manufactured, using the RHEED method. FIGS. 4A and 4B are graphs illustrating results of studying the outermost surface of the substrate for electronic devices shown in FIG. 1 by an X-ray diffraction (XRD) method, wherein FIG. 4A represents the result of θ–2θ scanning, and 4B represents the result of omega scanning of an $SrRuO_3$ (200) peak.

At first, the configuration of the substrate for electronic devices according to this embodiment will be described.

The substrate 100 for electronic devices according to this embodiment comprises an Si substrate comprising a (100) plane, a first buffer layer 12 comprising a metal oxide having a fluorite structure epitaxially grown in a cubic (100) orientation on the Si substrate 11, a second buffer layer 13 comprising a metal oxide having a fluorite structure epitaxially grown in a cubic (100) orientation on the first buffer layer 12, a first oxide electrode layer 14 having a perovskite structure epitaxially grown in a tetragonal or orthorhombic (001) orientation on the second buffer layer 13, and a second oxide electrode layer 15 having a perovskite structure epitaxially grown in a cubic or pseudo-cubic (100) orientation on the first oxide electrode layer 14.

For the Si substrate 11, a substrate in which the natural oxide film is not removed is used. In the first buffer layer 12, YSZ is epitaxially grown in the cubic (100) orientation to a thickness of 5 nm. In the second buffer layer 13, $CeO_2$ is epitaxially grown in the cubic (100) orientation to a thickness of 10 nm. In the first oxide electrode layer 14, $YBa_2Cu_3O_x$ is epitaxially grown in the tetragonal or orthorhombic (001) orientation. In the second oxide electrode layer 15, $SrRuO_3$ is epitaxially grown in the pseudo-cubic (100) orientation.

The manufacturing method for the substrate for electronic devices will now be described.

The Si (100) substrate 11 is soaked in an organic solvent, and degreasing wash is conducted, using an ultrasonic cleansing machine. For the organic solvent, for example, 1:1 liquid mixture of ethyl alcohol and acetone can be used, but it is not limited thereto. Moreover, it is not necessary to conduct a step for removing the natural oxide film, such as the RCA washing and washing with hydrofluoric acid, which are normal representative washing methods for Si substrates. As a result, as shown in FIG. 2A, the natural oxide film is formed on the surface of the Si (100) substrate 11.

After loading the degreased Si (100) substrate 11 in a substrate holder, the substrate holder is introduced into a vacuum device in which the back pressure at room temperature is kept as $1\times10^{-8}$ Torr, and the vacuum device is heated to warm up to a temperature of 700° C. at a rate of 10° C./min., using an infrared ray lamp. During heating, in a temperature range of 500° C. or higher, the natural oxide film layer 16 evaporates partly as SiO, and hence the pressure increases to $1\times10^{-6}$ Torr or higher, but at a temperature of 700° C., the pressure becomes constant at not higher than $5\times10^{-7}$ Torr. However, as shown in FIG. 3A, it is seen that a diffraction pattern is not observed in the RHEED pattern from an Si <011> direction, and a reconstructed surface is not formed in the Si (100), and hence, the Si substrate is covered with a natural oxide film layer 16 shown in FIG. 2A. The conditions of warm-up rate, substrate temperature, pressure and the like are not limited to these, provided they are within a range that does not form a new thermal oxide film on the surface of the Si substrate.

After the pressure becomes constant, pulsed radiation of a KrF excimer laser (wavelength: 248 nm) is shone onto the YSZ target surface arranged opposite to the Si (100) substrate 11, under conditions of an energy density of 2.5 $J/cm^2$, a frequency of 10 Hz, and a pulse length of 10 ns, to generate a plasma plume consisting of Y, Zr and O on the target surface. This plasma plume is irradiated onto the Si (100) substrate 11 located at a position away from the target by 40 mm, for 10 minutes under conditions of a substrate temperature of 700° C., and a pressure during deposition of $5 \times 10^{-5}$ Torr, so that the YSZ first buffer layer 12 is deposited to 5 nm (FIG. 2B). As shown in FIG. 3B, a diffraction pattern has appeared in the RHEED pattern from the Si <011> direction, and it is clearly seen that the epitaxial growth is achieved in an azimuthal relation of YSZ (100)/Si (100), YSZ <011>//Si<011>.

Of the respective conditions, it is desired that the target composition is YSZ, the substrate temperature is from 600° C. to 800° C. inclusive, and the back pressure during deposition is not higher than $5 \times 10^{-4}$ Torr. However, the respective conditions are not limited thereto, so long as the oxide layer $SiO_2$ (natural oxide film) on the surface of the Si substrate 11 is reduced to Si, by irradiating a Zr gas or plasma onto the Si substrate 11 held at a temperature, a back pressure and an oxygen partial pressure such that the vapor pressure of SiO does not reach the saturated vapor pressure, and so long as YSZ can be grown epitaxially while removing Si by sublimating the Si formed by reduction as SiO. Of the respective conditions, it is desired that the laser energy density is not lower than 1 $J/cm^2$, the laser frequency is not lower than 5 Hz, and the target-substrate distance is from 50 mm to 80 mm inclusive. However, the respective conditions are not limited thereto, so long as the deposition rate of YSZ is not lower than the growth rate (0.2 nm/min.) of the thermally oxidized $SiO_2$ film on the surface of the Si substrate, and YSZ can be grown epitaxially without forming the thermally oxidized $SiO_2$ film on the surface of the Si substrate 11.

However, depending on the conditions, there may be a case where the YSZ first buffer layer 12 does not change, but oxygen is supplied to the interface between the Si (100) substrate 11 and the YSZ first buffer layer 12, to thereby form a thermal oxide film. Moreover, if $ZrO_2$ forms a solid solution as a cubic, then similar effects can be obtained when at least one of La, Ce, Pr, Nd, Pm, Sm, Eu, Gd, Tb, Dy, Ho, Er, Tm, Yb, Lu, Mg, Ca, Sr and Ba is added instead of Y.

After having deposited the YSZ first buffer layer 12, pulsed radiation of the KrF excimer laser is shone onto a $CeO_2$ target surface arranged opposite to the substrate, under conditions of an energy density of 2.5 $J/cm^2$, a frequency of 10 Hz, and a pulse length of 10 ns, to generate a plasma plume consisting of Ce and O on the target surface. This plasma plume is irradiated onto the Si (100) substrate 11 located at a position away from the target by 40 mm, for 10 minutes under conditions of a substrate temperature of 700° C., and a pressure during deposition of $5 \times 10^{-5}$ Torr, so that the $CeO_2$ second buffer layer 13 is deposited to 10 nm (FIG. 2C). As shown in FIG. 3C, a diffraction pattern has appeared in the RHEED pattern from the Si 011> direction, and it is clearly seen that the epitaxial growth is achieved in an orientation relation of $CeO_2$ (100)/YSZ (100)/Si (100), and in an azimuthal relation of $CeO_2$ <011>//YSZ<011>//Si011>.

Of the respective conditions, it is desired that the target composition is $CeO_2$, the laser energy density is from 2 $J/cm^2$ to 3 $J/cm^2$ inclusive, the laser frequency is not lower than 5 Hz and not higher than 15 Hz, the target-substrate distance is from 30 mm to 50 mm inclusive, the substrate temperature is from 650° C. to 750° C. inclusive, and the pressure during deposition is from $1 \times 10^{-5}$ Torr to $1 \times 10^{-4}$ Torr inclusive. However, the respective conditions are not limited thereto, so long as the epitaxial growth as $CeO_2$ is possible. Moreover, if $CeO_2$ forms a solid solution as a cubic, then similar effects can be obtained when at least one of Zr, La, Pr, Nd, Pm, Sm, Eu, Gd, Tb, Dy, Ho, Er, Tm, Yb, Lu, Mg, Ca, Sr and Ba is added.

After having deposited the $CeO_2$ second buffer layer 13, pulsed radiation of the KrF excimer laser is shone onto a $YBa_2Cu_3O_x$ target surface arranged opposite to the substrate, under conditions of an energy density of 2.5 $J/cm^2$, a frequency of 5 Hz, and a pulse length of 10 ns, to generate a plasma plume consisting of Y, Ba, Cu and O on the target surface. This plasma plume is irradiated onto the Si substrate 11 located at a position away from the target by 40 mm, for 2 minutes under conditions of a substrate temperature of 600° C., and an oxygen partial pressure during deposition of $1 \times 10^{-2}$ Torr, so that the $YBa_2Cu_3O_x$ first oxide electrode layer 14 is deposited to 2 nm (FIG. 2D).

Figure 3D:
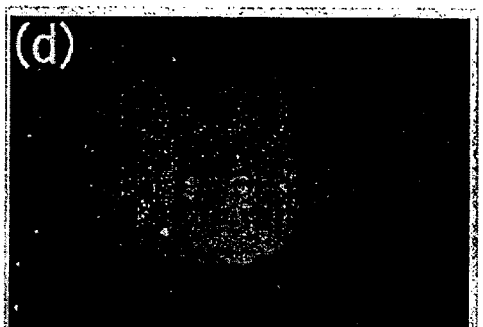
Figure 4A:
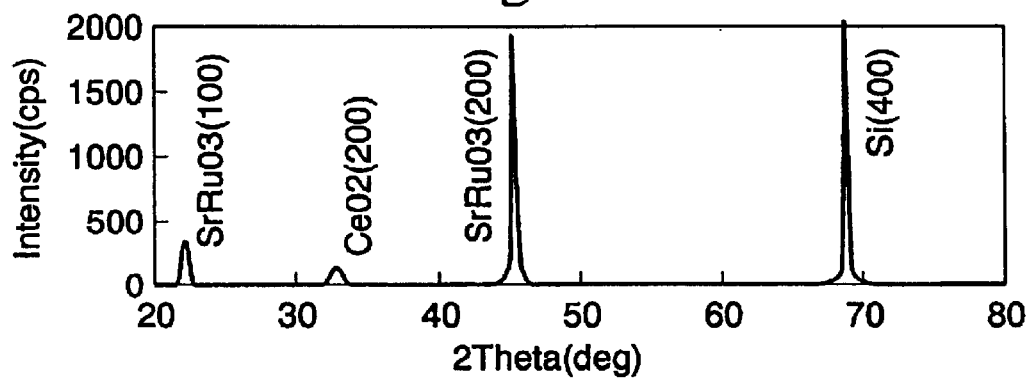
FIGS. 4A and 4B are graphs illustrating results of studying the outermost surface of the substrate for electronic devices according to the present invention by an X-ray diffraction method.
Figure 4B:
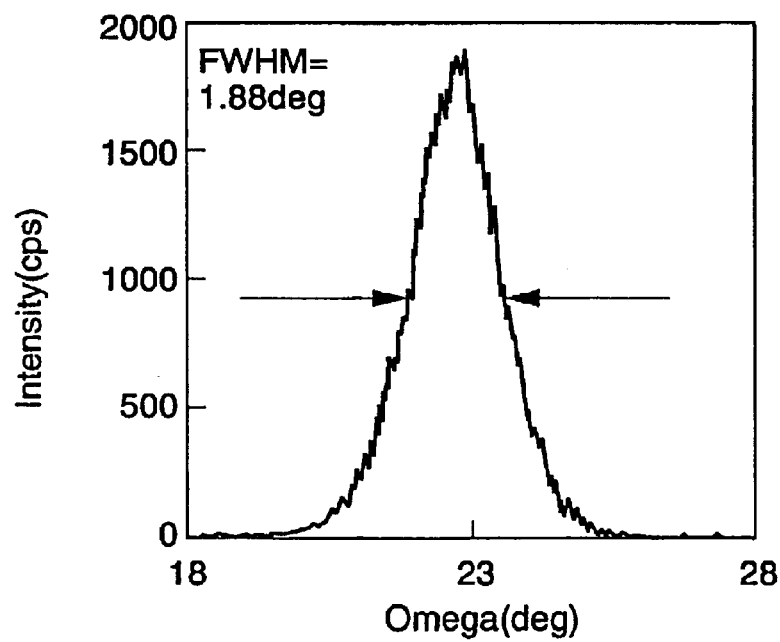

As shown in FIG. 3D, a clear diffraction pattern has appeared in the RHEED pattern from the Si <011> direction, and it is clearly seen that there is an orientation relation of $YBa_2Cu_3O_x$ (001)/$CeO_2$ (100)/YSZ (100)/Si (100), and an azimuthal relation of $YBa_2Cu_3O_x$ <100>//$CeO_2$ <011>//YSZ <011>//Si <011>. Of the respective conditions, it is desired that the target composition is $YBa_2Cu_3O_x$, the laser energy density is from 2 $J/cm^2$ to 3 $J/cm^2$ inclusive, the laser frequency is not lower than 2 Hz and not higher than 10 Hz, the target-substrate distance is from 30 mm to 50 mm inclusive, the substrate temperature is from 550° C. to 650° C. inclusive, and the pressure during deposition is from $1 \times 10^{-3}$ Torr to $1 \times 10^{-1}$ Torr inclusive. However, the respective conditions are not limited thereto, so long as the epitaxial growth as $YBa_2Cu_3O_1$ is possible.

Moreover, similar effects can be obtained by using $M_2RuO_4$ (M=Ca, Sr or Ba), $RE_2NiO_4$ (RE=La, Ce, Pr, Nd, Pm, Sm, Eu, Gd, Tb, Dy, Ho, Er, Tm, Yb, Lu or Y), or $REBa_2Cu_3O_x$ (RE=La, Ce, Pr, Nd, Pm, Sm, Eu, Gd, Tb, Dy, Ho, Er, Tm, Yb or Lu), instead of $YBa_2Cu_3O_x$.

After having deposited the $YBa_2Cu_3O_x$ first oxide electrode layer 14, pulsed radiation of the KrF excimer laser is shone onto an $SrRuO_3$ target surface arranged opposite to the substrate, under conditions of an energy density of 2.5 $J/cm^2$, a frequency of 5 Hz, and a pulse length of 10 ns, to generate a plasma plume consisting of Sr, Ru and O oil the target surface. This plasma plume is irradiated onto the Si substrate 11 located at a position away from the target by 40 mm, for 30 minutes under conditions of a substrate temperature of 600° C., and an oxygen partial pressure during deposition of $1 \times 10^{-2}$ Torr, so that the $SrRuO_3$ second oxide electrode layer 15 is deposited to 100 nm (FIG. 2E).

Figure 3E:

As shown in FIG. 3E, a diffraction pattern has appeared in the RHEED pattern from the Si <011> direction, and it is clearly seen that there is an orientation relation of $SrRuO_3$ (100)/$YBa_2Cu_3O_x$ (001)/$CeO_2$ (100)/YSZ (100)/Si (100), and an azimuthal relation of $SrRuO_3$ <010>//$YBa_2Cu_3O_x$ <100>//$CeO_2$ <011>//YSZ <011>//Si <011respective conditions, it is desired that the target composition is $SrRuO_3$, the laser energy density is from 2 $J/cm^2$ to 3 $J/cm^2$ inclusive, the laser frequency is not lower than 2 Hz and not higher than 10 Hz, the target-substrate distance is from 30 mm to 50 mm inclusive, the substrate temperature is from 550° C. to 650° C. inclusive, and the oxygen partial pressure during deposition is from $1 \times 10^{-3}$ Torr to $1 \times 10^{-1}$ Torr inclusive. However, the respective conditions are not limited thereto, so long as the Sr and Ru plasma can reach the substrate at a constant ratio of 1:1, and the epitaxial growth as $SrRuO_3$ is possible.

Moreover, similar effects can be obtained by using $MRuO_3$ (M=Ca or Ba), (RE M)$CrO_3$ (RE=La, Ce, Pr, Nd, Pm, Sm, Eu, Gd, Tb, Dy, Ho, Er, Tm, Yb, Lu or Y; M=Ca, Sr, or Ba), (RE M)MnO$_3$ (RE=La, Ce, Pr, Nd, Pm, Sm, Eu, Gd, Tb, Dy, Ho, Er, Tm, Yb, Lu or Y; M=Ca, Sr, or Ba), (RE, M)CoO$_3$ (RE=La, Ce, Pr, Nd, Pm, Sm, Eu, Gd, Tb, Dy, Ho, Er, Tm, Yb, Lu or Y; M=Ca, Sr, or Ba), or (RE, M)NiO$_3$ (RE=La, Ce, Pr, Nd, Pm, Sm, Eu, Gd, Tb, Dy, Ho, Er, Tm, Yb, Lu or Y), instead of SrRuO$_3$.

The XRD θ–2θ scan of the thus obtained substrate 100 for electronic devices is shown in FIG. 4A, wherein peaks of pseudo-cubic SrRuO$_3$ (100) and SrRuO$_3$ (200) are clearly observed, together with the peaks of Si (200) and Si (400), which agrees with the observation result by the RHEED, indicating the (100) orientation. An ω scan of the SrRuO$_3$ (200) peak is shown in FIG. 4B, by which it becomes clear that the full width at half maximum is 1.9 degrees, the crystallinity is excellent, and it is also useful as a foundation for epitaxial growth of a ferroelectric having the perovskite structure. Moreover, measurement of electrical resistivity by the four terminal method makes it clear that a favorable value of ρ=550 μΩcm can be obtained at a room temperature, and there is no problem in the basic characteristic as an electrode thin film.

Moreover, after the epitaxial growth process of the first buffer layer 12, by mechanically brushing off the substrate surface, using a cotton bud or a brush, droplets adhered on the substrate surface at the time of the epitaxial growth of the first buffer layer 12 are removed, and by executing the epitaxial growth processes of the second buffer layer 13 and the like, a clean and flat substrate surface without droplet particles can be obtained.

Furthermore, if layers up to the first oxide electrode layer 14 have epitaxially grown, then in the deposition step of the second oxide electrode layer 15, any film-forming method, such as an application method by spin coating, dip coating or ink jet printing, a chemical evaporation method such as MOCVD, and a physical vapor deposition method such as sputtering can be used instead of the laser ablation, to obtain similar effects.

According to the substrate for electronic devices having the above described configuration, a perovskite substrate for electronic devices pseudo-cubically oriented in the (100) direction can be deposited on the Si substrate coated with a natural oxide film, and as a lower electrode for allowing oxides having the perovskite structure to grow epitaxially this enables realization of improvement in the characteristics of various kinds of electronic devices, as represented by the ferroelectric capacitor.

Example 2

In this example, the ferroelectric capacitor in which the substrate for electronic devices according to the present invention is used as the lower electrode, whose schematic sectional view is shown in FIG. 5, and the manufacturing method therefor will be described.

The ferroelectric capacitor 200 according to this example comprises; an Si substrate 21 consisting of a (100) plane, a first buffer layer 22 comprising a metal oxide having a fluorite structure epitaxially grown in a cubic (100) orientation on the Si substrate 21, a second buffer layer 23 comprising a metal oxide having a fluorite structure epitaxially grown in a cubic (100) orientation on the first buffer layer 22, a first lower electrode layer 24 having a perovskite structure epitaxially grown in a tetragonal or orthorhombic (001) orientation on the second buffer layer 23, a second lower electrode layer 25 having a perovskite structure epitaxially grown in a cubic or pseudo-cubic (100) orientation on the first lower electrode layer 24, a ferroelectric layer 26 having a perovskite structure epitaxially grown in a tetragonal (001) orientation on the second lower electrode layer 25, and an upper electrode layer 27 formed on the ferroelectric layer 26.

For the Si substrate 21, a substrate in which the natural oxide film is not removed is used. In the first buffer layer 22, YSZ is epitaxially grown in the cubic (100) orientation to a thickness of 5 nm. In the second buffer layer 23, CeO$_2$ is epitaxially grown in the cubic (100) orientation to a thickness of 10 nm. In the first oxide electrode layer 24, YBa$_2$Cu$_3$O$_x$ is epitaxially grown in the tetragonal or orthorhombic (001) orientation, to a thickness of 2 nm. In the second oxide electrode layer 25, SrRuO$_3$ is epitaxially grown in the pseudo-cubic (100) orientation, to a thickness of 100 nm. In the ferroelectric layer 26, PbZr$_{0.40}$Ti$_{0.60}$O$_3$ is epitaxially grown in the tetragonal (001) orientation. Pt is used for the upper electrode layer 27.

The manufacturing method for the ferroelectric capacitor will be described below.

The washing step of the Si (100) substrate 21, the heating and warm-up step, the deposition step of the first buffer layer 22, the deposition step of the second buffer layer 23, the deposition step of the first lower electrode layer 24, and the deposition step of the second lower electrode layer 25 are the same as in the manufacturing method for the substrate 100 for electronic devices shown in Example 1. After having deposited the second lower electrode layer 25, pulsed radiation of the KrF excimer laser is shone onto a PbZr$_{0.40}$Ti$_{0.60}$O$_3$ target surface arranged opposite to the substrate, under conditions of an energy density of 2.0 J/cm$^2$, a frequency of 5 Hz, and a pulse length of 10 ns, to generate a plasma plume consisting of Pb, Zr, Ti and O on the target surface. This plasma plume is irradiated onto the Si substrate 21 located at a position away from the target by 40 mm, for 30 minutes under conditions of a substrate temperature of 600° C., and an oxygen partial pressure during deposition of 1×10$^{-2}$ Torr, so that the PbZr$_{0.40}$Ti$_{0.60}$O$_3$ ferroelectric layer 24 is deposited to 150 nm.

Of the respective conditions, it is desired that the target composition is PZT, the laser energy density is from 1.0 J/cm$^2$ to 3.0 J/cm$^2$ inclusive, the laser frequency is not lower than 2 Hz and not higher than 10 Hz, the target-substrate distance is from 30 mm to 50 mm inclusive, the substrate temperature is from 550° C. to 650° C. inclusive, and the oxygen partial pressure during deposition is from 1×10$^{-3}$ Torr to 1×10$^{-1}$ Torr inclusive. However, the respective conditions are not limited thereto, so long as the epitaxial growth as PZT is possible. Moreover, similar effects can be obtained by using ferroelectrics having the perovskite structure, as represented by BaTiO$_3$, KNbO$_3$, and BiFeO$_3$, and solid solutions of these ferroelectrics and various kinds of paraelectrics, instead of PZT.

After having deposited the PZT ferroelectric layer 26, etching is performed by using a known method such as photolithography, and the second lower electrode layer 25 is taken out, and a Pt upper electrode layer 27 is deposited by a known method such as sputtering, while using a mask pattern. Similar effects can be obtained by using other electrode materials generally used for electrodes, such as Ir, instead of Pt.

The thus obtained ferroelectric capacitor 200 has an orientation relation of Pt/PZT (001)/SrRuO$_3$ (100)/ YBa$_2$Cu$_3$O$_x$ (001)/CeO$_2$ (100)/YSZ (100)/Si (100), and an azimuthal relation of PZT<010>//SrRuO$_3$ <010>// YBa$_2$Cu$_3$O$_x$ <100>//CeO$_2$ <011 <011>//Si <011> within a plane.

As a result of P-E hysteresis measurement with respect to the obtained ferroelectric capacitor 200 by applying an electric field having a frequency of 1 kHz and an amplitude of 100 kV/cm, a remanence $P_r$=90 $\mu$C/cm$^2$ was obtained. This indicates a higher characteristic than $P_r$=50 $\mu$C/cm$^2$ for the ferroelectric capacitor in which a non-oriented PZT ferroelectric layer was used.

Moreover, if layers up to the second lower electrode layer 25 have epitaxially grown, then in the deposition step of the ferroelectric layer 26, any film-forming method, such as an application method by spin coating, dip coating or ink jet printing, a chemical evaporation method such as MOCVD, and a physical vapor deposition method such as sputtering can be used instead of the laser ablation, to obtain similar effects.

According to the ferroelectric capacitor in which the substrate for electronic devices having the above described configuration is used for the lower electrode, the tetragonal (001) epitaxial growth of the ferroelectric layer having the perovskite structure can be achieved, thereby realizing a ferroelectric memory having a ferroelectric capacitor excellent in the polarization characteristic.

Example 3

In this example, a piezoelectric actuator in which the substrate for electronic devices according to the present invention is used for the lower electrode, with the schematic sectional view thereof shown in FIG. 6, and a manufacturing method therefor will be described.

The piezoelectric actuator 300 according to this example comprises; an Si substrate 31 consisting of a (100) plane, a first buffer layer 32 comprising a metal oxide having a fluorite structure epitaxially grown in a cubic (100) orientation on the Si substrate 31, a second buffer layer 33 comprising a metal oxide having a fluorite structure epitaxially grown in a cubic (100) orientation on the first buffer layer 32, a first lower electrode layer 34 having a perovskite structure epitaxially grown in a tetragonal or orthorhombic (001) orientation on the second buffer layer 33, a second lower electrode layer 35 having a perovskite structure epitaxially grown in a cubic or pseudo-cubic (100) orientation on the first lower electrode layer 34, a piezoelectric layer 36 having a perovskite structure epitaxially grown in a rhombohedral (100) orientation on the second lower electrode layer 35, and an upper electrode layer 37 formed on the piezoelectric layer 36.

On an interface between the Si substrate 31 and the buffer layer 32, oxygen is supplied to form an SiO$_2$ thermal oxide film layer 38, which serves as a resilient board in the actuator, together with the Si substrate 31. For the Si substrate 31, a substrate in which the natural oxide film is not removed was used. In the first buffer layer 32, YSZ is epitaxially grown in the cubic (100) orientation to a thickness of 5 nm. In the second buffer layer 33, CeO$_2$ is epitaxially grown in the cubic (100) orientation to a thickness of 10 nm. In the first oxide electrode layer 34, YBa$_2$Cu$_3$O$_x$ is epitaxially grown in the tetragonal or orthorhombic (001) orientation, to a thickness of 2 nm. In the second oxide electrode layer 35, SrRuO$_3$ is epitaxially grown in the pseudo-cubic (100) orientation, to a thickness of 100 nm. In the piezoelectric layer 36, PbZr$_{0.55}$Ti$_{0.45}$O$_3$ is epitaxially grown in the rhombohedral (100) orientation. Ir is used for the upper electrode layer 37.

The manufacturing method for the piezoelectric actuator will flow be described.

The washing step of the Si (100) substrate 31, the heating and warm-up step, the deposition step of the first buffer layer 32, the deposition step of the second buffer layer 33, the deposition step of the first lower electrode layer 34, and the deposition step of the second lower electrode layer 35 are the same as in the manufacturing method for the substrate 100 for electronic devices shown in Example 1. After having deposited the lower electrode layer 35, pulsed radiation of the KrF excimer laser is shone onto a PbZr$_{0.55}$Ti$_{0.45}$O$_3$ target surface arranged opposite to the substrate, under conditions of an energy density of 2.0 J/cm$^2$, a frequency of 10 Hz, and a pulse length of 10 ns, to generate a plasma plume consisting of Pb, Zr, Ti and O on the target surface. This plasma plume is irradiated onto the Si substrate 31 located at a position away from the target by 40 mm, for 90 minutes under conditions of a substrate temperature of 600° C., and an oxygen partial pressure during deposition of 1×10$^{-2}$ Torr, so that the PbZr$_{0.55}$Ti$_{0.45}$O$_3$ piezoelectric layer 36 is deposited to 900 nm. At this time, oxygen is supplied to the interface between the Si substrate 31 and the YSZ first buffer layer 32 to form an SiO$_2$ thermal oxide film layer 38 to a thickness of 500 nm.

Of the respective conditions, it is desired that the target composition is PZT, the laser energy density is from 1.0 J/cm$^2$ to 3.0 J/cm$^2$ inclusive, the laser frequency is not lower than 5 Hz and not higher than 15 Hz, the target-substrate distance is from 30 mm to 50 mm inclusive, the substrate temperature is from 550° C. to 650° C. inclusive, and the oxygen partial pressure during deposition is from 1×10$^{-3}$ Torr to 1×10$^{-1}$ Torr inclusive. However, the respective conditions are not limited thereto, so long as the Pb, Zr and Ti plasma can reach the substrate at a desired constant ratio, and the epitaxial growth as PZT is possible. Moreover, similar effects can be obtained by using ferroelectrics having the perovskite structure, as represented by Pb(Mb, Nb)O$_3$, Pb(Zn, Nb)O$_3$, BaTiO$_3$, KNbO$_3$, and BiFeO$_3$, and solid solutions of these ferroelectrics and various kinds of paraelectrics, instead of PZT.

After having deposited the PZT piezoelectric layer 36, etching is performed by using a known method such as photolithography, and the lower electrode layer 35 is taken out, and an Ir upper electrode layer 37 is deposited by a known method such as sputtering, while using a mask pattern. Similar effects can be obtained by using other electrode materials generally used for electrodes, such as Pt, instead of Ir.

The thus obtained piezoelectric capacitor 300 has an orientation relation of Ir/PZT (100)/SrRuO$_3$ (100)/YBa$_2$Cu$_3$O$_x$ (001)/CeO$_2$ (100)/YSZ (100)/Si (100), and an azimuthal relation of PZT <010>//SrRuO$_3$ <010>//YBa$_2$Cu$_3$O$_x$ <100>//CeO$_2$ <011 >//YSL <011>//Si <011>.

As a result of measurement of the field distortion characteristic with respect to the obtained piezoelectric actuator 300, by applying an electric field having a frequency of 1 kHz and an amplitude of 100 kV/cm, a piezoelectric constant $d_{31}$=200 pC/N has been obtained. This piezoelectric actuator has a higher field distortion characteristic as a piezoelectric actuator, as compared with $d_{31}$=160 pC/N of a piezoelectric actuator using a non-oriented PZT piezoelectric actuator layer. This can be considered to be an effect of an engineered domain in which the piezoelectric effect increases when angles between a polarizing axis of each domain in the piezoelectric layer and the electric field are all equal and not 0 degrees.

Moreover, if layers up to the second lower electrode layer 35 have epitaxially grown, then in the deposition step of the piezoelectric layer 36, any film-forming method, such as an application method by spin coating, dip coating or ink jet printing, a chemical evaporation method such as MOCVD, and a physical vapor deposition method such as sputtering can be used instead of the laser ablation, to obtain similar effects.

According to the piezoelectric actuator in which the substrate for electronic devices having the above configuration is used for the lower electrode, it has been confirmed that the rhombohedral (100) epitaxial growth of the piezoelectric layer having the perovskite structure can be achieved, thereby enabling improvement in the field distortion characteristic of the piezoelectric element.

What is claimed is:

1. A manufacturing method for a substrate for electronic devices comprising:
    a pretreatment step for washing a substrate consisting of silicon and having a film-forming surface;
    a first film-forming step in which the substrate having been subjected to said pretreatment step is arranged in a film-forming container under a reduced-pressure atmosphere, and a predetermined gas or plasma is irradiated onto the film-forming surface of said substrate, to epitaxially grow a first buffer layer comprising a first metal oxide having a fluorite structure;
    a second film-forming step in which a predetermined gas or plasma is irradiated onto the surface of said first buffer layer, to epitaxially grow a second buffer layer comprising a second metal oxide having a fluorite structure;
    a third film-forming step in which a predetermined gas or plasma is irradiated onto the surface of said second buffer layer, to epitaxially grow a first oxide electrode layer comprising a third metal oxide having a layered perovskite structure; and
    a fourth film-forming step in which a predetermined gas or plasma is irradiated onto the surface of said first oxide electrode layer, to epitaxially grow a second oxide electrode layer comprising a fourth metal oxide having a simple perovskite structure.

2. A manufacturing method for a substrate for electronic devices according to claim 1, wherein in said first film-forming step, a gas or plasma of a constituent element of said first buffer layer is irradiated onto the film-forming surface of said substrate held under a temperature, a back pressure and an oxygen partial pressure such that the vapor pressure of SiO does not reach the saturated vapor pressure.

3. A manufacturing method for a substrate for electronic devices according to claim 2, wherein in said first film-forming step, an $SiO_2$ film forming an oxide layer existing on the film-forming surface of said substrate is reduced to Si, and a first metal oxide layer constituting said first buffer layer is deposited, while sublimating and removing the Si formed by reduction as SiO.

4. A manufacturing method for a substrate for electronic devices according to claim 2, wherein in said first film-forming step, when forming said first buffer layer, the temperature of said substrate is 800° C. or higher, the back pressure in said film-forming atmosphere is not lower than $1 \times 10^{-6}$ Torr, and the oxygen partial pressure in said film-forming atmosphere is not lower than $5 \times 10^{-6}$ Torr.

5. A manufacturing method for a substrate for electronic devices according to claim 4, wherein in said first film-forming step, when forming said first buffer layer, the temperature of said substrate is from 600° C. to 800° C. inclusive, the back pressure in the film-forming atmosphere is from $1 \times 10^{-6}$ Torr to $5 \times 10^{-6}$ Torr inclusive, and the oxygen partial pressure in said film-forming atmosphere is from $5 \times 10^{-6}$ Torr to $5 \times 10^{-4}$ Torr inclusive.

6. A manufacturing method for a substrate for electronic devices according to claim 2, wherein in said first film-forming step, said first buffer layer is formed at an deposition rate not lower than a growth rate of a thermally oxidized $SiO_2$ film on the film-forming surface of said substrate.

7. A manufacturing method for a substrate for electronic devices according to claim 6, wherein in said first film-forming step, said first buffer layer is epitaxially grown on said film-forming surface after removing said $SiO_2$ film, without forming a thermally oxidized $SiO_2$ film.

8. A manufacturing method for a substrate for electronic devices according to claim 6, wherein in said first film-forming step, the deposition rate of said first buffer layer is not lower than 0.2 nm/min.

9. A manufacturing method for a substrate for electronic devices according to claim 1, wherein said predetermined gases or plasmas comprise elements constituting metal oxides to be formed in each step of said first film-forming step, said second film-forming step, said third film-forming step and said fourth film-forming step.

10. A manufacturing method for a substrate for electronic devices according to claim 1, wherein said predetermined gas or plasma is generated by irradiating a laser beam onto a base metal arranged opposite to the film-forming surface of said substrate.

11. A manufacturing method for a substrate for electronic devices according to claim 1, wherein in said pretreatment step, the film-forming surface of said substrate is finished as a surface where an oxide layer exists, not as a reconstructed surface or a hydrogen-terminated surface.

* * * * *